United States Patent
Kuramoto et al.

(10) Patent No.: US 9,011,728 B2
(45) Date of Patent: Apr. 21, 2015

(54) METHOD FOR PRODUCING CONDUCTIVE MATERIAL, CONDUCTIVE MATERIAL OBTAINED BY THE METHOD, ELECTRONIC DEVICE CONTAINING THE CONDUCTIVE MATERIAL, AND LIGHT-EMITTING DEVICE

(75) Inventors: Masafumi Kuramoto, Tokushima (JP); Satoru Ogawa, Anan (JP); Miki Niwa, Tokushima (JP); Katsuaki Suganuma, Suita (JP); Keun-Soo Kim, Suita (JP)

(73) Assignee: Nichia Corporation, Anan-Shi (JP)

( * ) Notice: Subject to any disclaimer, the term of this patent is extended or adjusted under 35 U.S.C. 154(b) by 538 days.

(21) Appl. No.: 12/991,843

(22) PCT Filed: Jul. 21, 2010

(86) PCT No.: PCT/JP2010/062231
§ 371 (c)(1),
(2), (4) Date: Nov. 23, 2010

(87) PCT Pub. No.: WO2011/010659
PCT Pub. Date: Jan. 27, 2011

(65) Prior Publication Data
US 2011/0186340 A1  Aug. 4, 2011

(30) Foreign Application Priority Data
Jul. 21, 2009 (JP) ................................ 2009-170526

(51) Int. Cl.
*H01B 1/00* (2006.01)
*H01B 1/22* (2006.01)
*H01L 23/00* (2006.01)

(52) U.S. Cl.
CPC ..... *H01B 1/22* (2013.01); *H01L 24/29* (2013.01); *H01L 24/83* (2013.01);
(Continued)

(58) Field of Classification Search
USPC .......................... 252/500; 257/789; 156/89.11
See application file for complete search history.

(56) References Cited

U.S. PATENT DOCUMENTS

| 7,276,185 B2 | 10/2007 | Totokawa et al. |
| 2001/0050370 A1 | 12/2001 | Sakamoto et al. |

(Continued)

FOREIGN PATENT DOCUMENTS

| EP | 1950767 A1 | 7/2008 |
| JP | 6-4790 A | 1/1994 |

(Continued)

OTHER PUBLICATIONS

"Bonding of IC Chips with Silver Fine Particles—A New Technology on Substrate Developed by Osaka Univ. and Others," The Nikkei Business Daily, Jan. 28, 2009.

(Continued)

*Primary Examiner* — Khanh Tuan Nguyen
(74) *Attorney, Agent, or Firm* — Birch, Stewart, Kolasch & Birch, LLP

(57) ABSTRACT

The object of the present invention is to provide a method for producing a conductive material that has a low electric resistivity and that is obtained using an inexpensive and stable conductive material composition. A conductive material having a low electric resistivity can be obtained by a method including the step of heating a conductive material composition that contains at least one of a full-cured or semi-cured thermosetting resin and a thermoplastic resin, as well as silver particles. Such a conductive material is a conductive material that includes fused silver particles, and thermosetting resin fine particles that have an average particle diameter of 0.1 μm to 10 μm both inclusive and are dispersed in the fused silver particles. Further, in such a conductive material is a conductive material that includes fused silver particles, and a thermoplastic resin welded among the fused silver particles.

18 Claims, 19 Drawing Sheets

(52) U.S. Cl.
CPC ............... *H01L 2224/8384* (2013.01); *H01L 2924/01004* (2013.01); *H01L 2924/01012* (2013.01); *H01L 2924/01013* (2013.01); *H01L 2924/01025* (2013.01); *H01L 2924/01029* (2013.01); *H01L 2924/0103* (2013.01); *H01L 2924/01032* (2013.01); *H01L 2924/01033* (2013.01); *H01L 2924/01038* (2013.01); *H01L 2924/01047* (2013.01); *H01L 2924/0105* (2013.01); *H01L 2924/01056* (2013.01); *H01L 2924/01058* (2013.01); *H01L 2924/01079* (2013.01); *H01L 2924/01082* (2013.01); *H01L 2924/09701* (2013.01); *H01L 2224/29* (2013.01); *H01L 2224/2919* (2013.01); *H01L 2224/32245* (2013.01); *H01L 2924/01005* (2013.01); *H01L 2924/01006* (2013.01); *H01L 2924/01019* (2013.01); *H01L 2924/0102* (2013.01); *H01L 2924/01024* (2013.01); *H01L 2924/0104* (2013.01); *H01L 2924/01042* (2013.01); *H01L 2924/01045* (2013.01); *H01L 2924/01063* (2013.01); *H01L 2924/01074* (2013.01); *H01L 2924/01078* (2013.01); *H01L 2924/01322* (2013.01); *H01L 2924/014* (2013.01); *H01L 2924/0665* (2013.01); *H01L 2224/29101* (2013.01); *H01L 2924/0132* (2013.01); *H01L 2224/29111* (2013.01); *H01L 2224/73265* (2013.01); *H01L 2224/2929* (2013.01); *H01L 2224/83439* (2013.01); *H01L 2924/15747* (2013.01); *H01L 2224/29339* (2013.01); *H01L 2924/00013* (2013.01); *H01L 2224/48097* (2013.01); *H01L 24/48* (2013.01); *H01L 2224/48247* (2013.01); *H01L 2224/45144* (2013.01); *H01L 2224/48091* (2013.01); *H01L 24/45* (2013.01); *H01L 2224/45124* (2013.01); *H01L 2224/45139* (2013.01); *H01L 2224/45147* (2013.01); *H01L 2224/85205* (2013.01); *H01L 2924/07802* (2013.01); *H01L 2924/12041* (2013.01)

(56) References Cited

U.S. PATENT DOCUMENTS

| | | | |
|---|---|---|---|
| 2001/0052600 | A1 | 12/2001 | Sakamoto et al. |
| 2004/0084131 | A1* | 5/2004 | Konoue et al. ............ 156/89.11 |
| 2004/0214418 | A1 | 10/2004 | Noda et al. |
| 2005/0116203 | A1* | 6/2005 | Takahashi et al. ............ 252/500 |
| 2006/0038304 | A1* | 2/2006 | Osako et al. ................ 257/789 |
| 2006/0065901 | A1 | 3/2006 | Aoyagi et al. |
| 2007/0074391 | A1 | 4/2007 | Totokawa et al. |
| 2007/0079665 | A1 | 4/2007 | Sasaki et al. |
| 2008/0138238 | A1 | 6/2008 | Sasaki et al. |
| 2009/0025967 | A1 | 1/2009 | Boureghda et al. |
| 2009/0162557 | A1 | 6/2009 | Lu et al. |

FOREIGN PATENT DOCUMENTS

| | | | | |
|---|---|---|---|---|
| JP | 6-302213 | A | 10/1994 | |
| JP | 8-148512 | A | 6/1996 | |
| JP | 10-284516 | A | 10/1998 | |
| JP | 10-308120 | A | 11/1998 | |
| JP | 11-111052 | A | 4/1999 | |
| JP | 2001-216839 | A | 8/2001 | |
| JP | 2001-325831 | A | 11/2001 | |
| JP | 2002-64225 | A | 2/2002 | |
| JP | 2003-309352 | A | 10/2003 | |
| JP | 2003-331648 | A | 11/2003 | |
| JP | 2004-128330 | A | 4/2004 | |
| JP | 2004-143324 | A | 5/2004 | |
| JP | 2004-153251 | A | 9/2004 | |
| JP | 2004-362950 | A | 12/2004 | |
| JP | 2005-48236 | A | 2/2005 | |
| JP | 2005-48237 | A | 2/2005 | |
| JP | 2005-93380 | A | 4/2005 | |
| JP | 2005-126726 | A | 5/2005 | |
| JP | 2005-129303 | A | 5/2005 | |
| JP | 2005-200604 | A | 7/2005 | |
| JP | 2005-267900 | A | 9/2005 | |
| JP | 2005-293851 | A | 10/2005 | |
| JP | 2006-24808 | A | 1/2006 | |
| JP | 2006-049147 | | * 2/2006 | ............... H01B 1/22 |
| JP | 2006-100500 | A | 4/2006 | |
| JP | 2006-137141 | A | 6/2006 | |
| JP | 2007-42301 | A | 2/2007 | |
| JP | 2007-53212 | A | 3/2007 | |
| JP | 2007-130538 | A | 5/2007 | |
| JP | 2007-157434 | A | 6/2007 | |
| JP | 2007-184153 | A | 7/2007 | |
| JP | 2007-258647 | A | 10/2007 | |
| JP | 2007-302953 | A | 11/2007 | |
| JP | 2008-195852 | A | 8/2008 | |
| JP | 2008-208442 | A | 9/2008 | |
| JP | 4347381 | B2 | 7/2009 | |
| WO | WO 03/085052 | A1 | 10/2003 | |
| WO | WO 2006/126614 | A1 | 11/2006 | |
| WO | WO 2007/034833 | A1 | 3/2007 | |

OTHER PUBLICATIONS

"High-heat Conductive Die Attach Technology by Using Inexpensive . . . ," Advanced Mounting Material-studying Field (Suganuma Lab.), Home page of Institute of Scientific and Industrial Research, Osaka Univ., Feb. 2009, http://www.sanken.osaka-u.ac.jp/jp/operation/research_activities.html.

Suganuma, "High-heat Conductivity Adhesive Technology Developed with Micron-size Silver Particles," Jan. 19, 2009.

Suganuma, "High-heat Conductivity Silver Paste Replacing Lead Solder, Developed by Osaka Univ.," Nikkan Kogyo Shinbun (Business & Technology Daily News), Feb. 6, 2009.

Wong, "Recent Advances of Conductive Adhesives as a Lead-free Alternative in Electronic Packaging: Materials, Processing, Reliability and Applications," Materials Science and Engineering, R51, Jan. 2006, pp. 1-35.

Japanese Information Offer Form dated Apr. 27, 2011 for Japanese Application No. 2009-13711.

U.S. Office Action dated May 13, 2011 for U.S. Appl. No. 12/691,999.

* cited by examiner

METHOD FOR PRODUCING CONDUCTIVE MATERIAL, CONDUCTIVE MATERIAL OBTAINED BY THE METHOD, ELECTRONIC DEVICE CONTAINING THE CONDUCTIVE MATERIAL, AND LIGHT-EMITTING DEVICE

TECHNICAL FIELD

The present invention relates to a method for producing a conductive material, a conductive material obtained by the method, an electronic device containing the conductive material, and a light-emitting device.

BACKGROUND ART

Generally, a conductive paste is composed of a binding agent such as a liquid-form epoxy resin or a liquid-form phenol resin, and a conductive powder (metal particles) composed principally of silver powder. In a conductive paste in which an epoxy resin is used as a binding agent, a hardener such as a polyamide resin or an amine is used, for the purpose of increasing or decreasing the curing speed. In the case of such a conductive paste, when the binding agent in the conductive paste is full-cured, interstices between metal particles in the conductive paste are narrowed, and as a result, the metal particles become dense thereby allowing electric current to flow, and thus electric connecting (conductive material) is produced. Metal particles in the conductive material thus obtained, however, are not fused with one another, and are not metal-bonded, either. For this reason, an electric resistivity obtained exceeds $5 \times 10^{-5}$ $\Omega \cdot cm$ in the case of this method, and to decrease the electric resistivity has been requested, for the purpose of practical application. Further, as to a conductive paste containing an epoxy-type one-component system hardener, a conductive paste containing a hardener having a high curing speed has a problem of lacking stability, while a conductive paste containing a hardener having a good stability has problems of a low curing speed and a poor adhesivity. Further, a conductive paste containing a phenol resin as a binding agent has appropriate adhesivity and stability, but has a problem of poor flexibility. Therefore, such a conductive paste has the following problem: in the case where an article on which the conductive paste is printed is flexible, cracking or delamination occurs in a printed circuit upon folding or bending.

Besides, anther conductive paste that contains, in place of the epoxy resin, an urethane polymer (liquid-form thermosetting resin), a polyhydric alcohol, a petroleum resin having a hydroxy group, and a conductive powder is known (see, for example, Patent Document 1). This conductive paste has characteristics of excellent adhesion to a circuit board, excellent flexibility, and a high curing speed. However, when the urethane polymer is full-cured, interstices between particles of the conductive powder are narrowed and the conductive powder becomes dense, which allows electric current to flow, and therefore a conductive material obtained from such a conductive paste has a relatively high electric resistivity of about $3.0 \times 10^{-4}$ $\Omega \cdot cm$ to $7.0 \times 10^{-4}$ $\Omega \cdot cm$. The conductive powder in the conductive material is not fused, and is not metal-bonded, either.

Further, another conductive resin paste is known which is composed of a resin mixture, a solvent, and a monodisperse fine-particle silver powder, wherein the resin mixture contains a thermosetting resin, a hardener, and a curing accelerator, the thermosetting resin being formed of at least one of an epoxy resin, a phenol resin, and a mixture of an epoxy resin and an imide resin, while the solvent is formed of glycidyl ether and an ester of a lower monoprotic acid and a lower primary or secondary alcohol (see, for example, Patent Document 2). Ester used as a solvent is intended to adjust the viscosity of the paste, to suppress the dissolution with a encapsulant or the like, to improve the storage stability, and to improve the dispersibility of the silver particles. Most of this ester volatilizes when the thermosetting resin in the conductive resin paste is full-cured. However, this conductive resin paste is also a type that allows electric current to flow when interstices between particles of the monodisperse fine-particle silver powder are narrowed thereby making the metal particles denser, and therefore an obtained conductive material has a low conductivity. Further, the silver powder in this conductive resin material is not fused, and is not metal-bonded, either.

Still further, as a conductive adhesive for surface mounting technology, a silver paste composed of a silver filler, an alcohol substance, and an epoxy resin is known, in which the alcohol substance has at least two —OH functional groups (hydroxy groups) per one molecule and is solid at room temperature (see, for example, Patent Document 3). This silver paste is applied over an electrode on a substrate and an electrode of an electronic component is caused to adhere thereto, whereby the electronic component is caused to adhere to the substrate. If this conductive adhesive for surface mounting technology is used, the alcohol substance therein eliminates any oxide film on the electrode of the substrate and any oxide film on the electrode of the electronic component, whereby a point contact is provided easily between the electrode of the substrate and the electrode of the electronic component. Further, a heat treatment to this conductive adhesive for surface mounting technology causes the epoxy resin in the silver paste to be full-cured. However, this conductive adhesive for mounting also allows electric current to flow when interstices between metal particles in the silver filler are narrowed thereby making the metal particles denser, and therefore an obtained conductivity is poor. Still further, the silver filler in the conductive material obtained from this conductive adhesive for surface mounting technology is not fused, and is not metal-bonded, either.

PRIOR ART DOCUMENT

Patent Document

Patent Document 1: JP 6 (1994)-4790 B
Patent Document 2: JP 6 (1994)-302213A
Patent Document 3: JP 2005-126726 A

SUMMARY OF INVENTION

Problem to be Solved by the Invention

As described above, with any of these conductive pastes, it is difficult to decrease the electric resistivity of the obtained conductive material.

In light of the above-described problem, it is an object of the present invention to provide a conductive material having an electric resistivity, and to provide a low-cost and simple method for producing a conductive material.

Means for Solving Problem

The inventors of the present invention completed the present invention, on the basis of the finding that silver particles get fused when heated to a certain temperature.

The present invention relates to a method for producing a conductive material, the method including the step of heating a conductive material composition, the conductive material composition containing: at least one of a full-cured or semi-cured thermosetting resin and a thermoplastic resin; and silver particles. With this, an inexpensive and simple method for producing a conductive material can be provided. Unlike in the conventional way in which silver particles are made denser as a thermosetting resin such as an epoxy resin is full-cured, so as to allow electric current to flow, the present invention has a configuration in which the silver particles are fused thereby being metal-bonded. Therefore, the electric resistivity can be reduced. It should be noted that the description of "silver particles" in the present specification, does not exclusively refer to "unoxidized silver particles", but also refer to "oxidized silver particles" and "a silver alloy". The "oxidized silver" means, for example, AgO, $Ag_2O$, and $Ag_2O_3$.

Further, according to the conventional method, electrodes of an electronic component and electrodes of a substrate are bonded with each other due to the curing of an epoxy resin or the like contained in a conductive paste, which provides only a low bonding strength. In contrast, according to the present invention, since the metal bonding is provided by the fusion of silver particles, a conductive material providing a greater bonding strength can be provided. It should be noted that the conductive material according to the present invention is useful for the bonding between the conductive material and a circuit board, a lead frame, or the like. Further, the conductive material according to the present invention is useful for the bonding between a light-emitting element and the conductive material. The circuit board, the lead frame, or the like, and the light-emitting element may have surfaces plated with silver (silver reflection film). When the circuit board, the lead frame, or the like and the light-emitting element have surfaces plated with silver, the conductive material can be fused with the silver plating. Therefore, the bonding strength for the bonding of the conductive material with the circuit board, the lead frame, or the like, and the light-emitting element can be increased, which is preferable. The "bonding strength" in the present specification refers to the bonding strength for the bonding of the conductive material with an article to be bonded such as a circuit board, a lead frame, or a light-emitting element in some cases (hereinafter such an article is referred to simply as "article" in some cases); and in other cases, when a circuit board, a lead frame, a light-emitting element, or the like has a surface plated with silver as described above, the "bonding strength" refers to the bonding strength for the bonding of the conductive material with this silver plating.

Further, the conventional method had the following problems: since a light-emitting element is requested to output a high power recently, high current is applied in response to this, which causes an adhesive to be discolored due to heat, light, etc.; and as a resin degrades with time, the state of adhesion of silver particles deteriorates, thereby causing an electric resistivity to vary with time. Particularly, in the case of a method in which the bonding completely relies on the adhesion power of an adhesive such as an epoxy resin, the content of epoxy resin in a conductive paste has to be increased. As a result, the resin components are present in a wide area on a surface of a conductive material, and the discoloration of epoxy resin in the obtained conductive material has become a serious problem. In contrast, with the present invention, since the metal bonding is achieved by the fusion of silver particles and therefore is not adversely affected by the degradation of a resin with time, the variation of the electric resistivity with time can be suppressed. Further, with the present invention, since the content of the resin in the conductive material composition can be reduced, the discoloration of the obtained conductive material with time can be suppressed.

The full-cured or semi-cured thermosetting resin or the thermoplastic resin in the present invention is preferably in a particulate form having an average particle diameter of 0.1 μm to 10 μm both inclusive. This makes it possible to provide a conductive material having excellent elasticity and flexibility. Besides, the delamination of a silver reflection film provided on an article can be reduced by increasing an added amount of the thermosetting resin or the thermoplastic resin.

In the present invention, an added amount of the full-cured thermosetting resin is preferably more than 0 wt % and not more than 5 wt % with respect to a weight of the silver particles. This makes it possible to reduce the delamination of a silver reflection film provided on an article.

In the present invention, an added amount of the semi-cured thermosetting resin or the thermoplastic resin is preferably more than 0 wt % and not more than 10 wt % with respect to a weight of the silver particles. This makes it possible to reduce the delamination of a silver reflection film (silver plating) provided on an article (e.g., a light-emitting element, or a lead frame).

The full-cured or semi-cured thermosetting resin or the thermoplastic resin in the present invention preferably has a glass transition temperature (Tg) lower than a fusion temperature of silver particles. In the case where such a resin is used, when a conductive material composition using s thermosetting resin in a full-cured particulate form is heated in the producing method of the present invention, the thermosetting resin maintaining the particulate form is scattered among the fused silver particles. On the other hand, in the case where a conductive material composition using a particulate semi-cured thermosetting resin or a thermoplastic resin is heated, both the thermosetting resin and the thermoplastic resin are molten, and adhere to the fused silver particles, in interstices among the same. Still further, in the producing method according to the present invention, since the metal bonding is provided by the fusion of the silver particles, the used amount of the thermosetting resin and the thermoplastic resin can be set much smaller than the amount of silver particles, and as a result, there is further less possibility that the resin hinders the fusion of the silver particles.

In the present invention, the full-cured thermosetting resin preferably has a glass transition temperature (Tg) of either −40° C. or lower, or 100° C. or higher. Since such a thermosetting resin does not have a glass transition temperature (Tg) in a range corresponding to the driving temperature range of electronic devices, the obtained conductive material does not have a non-linear volume variation, and causes only a smaller stress. Therefore, the delamination of a silver reflection film provided on an article, particularly a light-emitting element, due to metal fatigue can be reduced. The semi-cured thermosetting resin preferably has a glass transition temperature (Tg) of 100° C. or higher, and a melting start temperature of 100° C. or higher, too. Such a semi-cured thermosetting resin makes it possible to prevent fusion failure among silver particles one another, and between silver particles and a reflection film.

In the present invention, the thermoplastic resin preferably has a glass transition temperature (Tg) or a melting point of 100° C. or higher. Since such a thermoplastic resin does not have a glass transition temperature (Tg) in a range corresponding to the driving temperature range of electronic devices, the resin allows volume shrinkage of a conductive material obtained to decrease, and causes only a smaller stress. Therefore, the delamination of a silver reflection film provided on an article, particularly a light-emitting element, due to metal fatigue can be reduced. Besides, such a thermoplastic resin makes it possible to prevent fusion failure among silver particles one another, and between silver particles and a silver reflection film.

In the present invention, the conductive material composition may further include, in addition to the silver particles and the thermosetting or thermoplastic resin, either an organic solvent having a boiling point of 300° C. or lower, or water. Further, the silver particles, and either the thermosetting resin or the thermoplastic resin, may be immersed in the organic solvent or water. In this case, the silver particles can be filled in the organic solvent or water at a high concentration, without impairment of workability, which results in that volume shrinkage of the conductive material obtained after heating can be reduced. Further, the organic solvent or water improves the conformability among the silver particles, thereby promoting the fusion reaction of the silver particles.

The organic solvent preferably contains at least any of a lower alcohol, and a lower alcohol having one or more substituents selected from the group consisting of lower alkoxy, lower alkoxy substituted with lower alkoxy, amino, and halogen. This makes it possible to reduce the volume shrinkage of the conductive material after heating, without impairing workability, as well as without adversely affecting the conductive material obtained after heating.

The conductive material composition preferably further contains a metal oxide. The metal oxide is preferably one or more selected from the group consisting of AgO, $Ag_2O$, and $Ag_2O_3$. This is because such a metal oxide promotes the contact between the silver particles in the conductive material composition and oxygen, and as a result, the metal bonding of the silver particles can be achieved at a relatively low temperature.

Further, the present invention relates to a conductive material including: fused silver particles; and thermosetting resin fine particles having an average particle diameter of 0.1 μm to 10 μm both inclusive, the thermosetting resin fine particles being dispersed in the fused silver particles. Such a conductive material does not have a configuration, like the conventional configuration, such that the curing of a thermosetting resin such as an epoxy resin causes silver particles to become denser thereby allowing electric current to flow, but has a configuration that involves metal bonding achieved by the fusion of silver particles. Therefore, the conductive material of the present invention has a lower electric resistivity. Further, since such a conductive material has excellent elasticity and flexibility, the delamination of a silver reflection film can be reduced. Still further, such a conductive material makes it possible to maintain a high die-shear strength. The conductive material preferably has an electric resistivity of $4.0 \times 10^{-5}$ Ω·cm or less. The conductive material can have a lower electric resistivity, since it involves metal bonding achieved by the fusion of silver particles.

Still further, the present invention relates to a conductive material including: fused silver particles; and semi-cured thermosetting resin, welded and full-cured among the fused silver particles. Such a conductive material does not have a configuration, like the conventional configuration, such that the curing of a thermosetting resin such as an epoxy resin causes silver particles to become denser thereby allowing electric current to flow, but has a configuration that involves metal bonding achieved by the fusion of silver particles. Therefore, the conductive material of the present invention has a lower electric resistivity. Further, since such a conductive material has excellent elasticity and flexibility, the delamination of a silver reflection film can be reduced. Still further, such a conductive material makes it possible to maintain a high die-shear strength. The conductive material preferably has an electric resistivity of $4.0 \times 10^{-5}$ Ω·cm or less. The conductive material can have a lower electric resistivity, since it involves metal bonding achieved by the fusion of silver particles.

Still further, the present invention relates to a conductive material including: fused silver particles; and a thermoplastic resin welded among the fused silver particles. Such a conductive material does not have a configuration, like the conventional configuration, such that the curing of a thermosetting resin such as an epoxy resin causes silver particles to become denser thereby allowing electric current to flow, but has a configuration that involves metal bonding achieved by the fusion of silver particles. Therefore, the conductive material of the present invention has a lower electric resistivity. Further, since such a conductive material has excellent elasticity and flexibility, the delamination of a silver reflection film can be reduced. Still further, such a conductive material makes it possible to maintain a high die-shear strength. The conductive material preferably has an electric resistivity of $4.0 \times 10^{-5}$ Ω·cm or less. The conductive material can have a lower electric resistivity, since it involves metal bonding achieved by the fusion of silver particles.

The present invention relates to a conductive material including: fused silver particles; and full-cured thermosetting resin fine particles having an average particle diameter of 0.1 μm to 10 μm both inclusive, the full-cured thermosetting resin fine particles being dispersed in the fused silver particles; and further, a semi-cured thermosetting resin and/or a thermoplastic resin, welded among the fused silver particles. Such a conductive material does not have a configuration, like the conventional configuration, such that the curing of a thermosetting resin such as an epoxy resin causes silver particles to become denser thereby allowing electric current to flow, but has a configuration that involves metal bonding achieved by the fusion of silver particles. Therefore, the conductive material of the present invention has a lower electric resistivity. Further, since such a conductive material has excellent elasticity and flexibility, the delamination of a silver reflection film can be reduced. Still further, such a conductive material makes it possible to maintain a high die-shear strength.

The conductive material preferably has an electric resistivity of $4.0 \times 10^{-5}$ Ω·cm or less. Since the conductive material involves metal bonding due to the fusion of silver particles, the electric resistivity can be reduced.

Still further, the present invention relates to an electronic device in which the above-mentioned conductive material is used as a material for electric connecting, component electrodes, die attach materials, or microbumps. Particularly, when the conductive material of the present invention including fused silver particles and a thermoplastic resin or semi-cured thermosetting resin molten by heating is welded among the fused silver particles is used, this conductive material can be deposited directly on a substrate such as a glass epoxy substrate or a BT resin substrate, whereby an electric connecting is formed. A semiconductor element is mounted on this substrate on which the electric connecting is provided, and heated to 150° C. or higher, whereby a semiconductor device having metal bonding can be provided. Since the metal bonding between the substrate provided with the electric connecting and the semiconductor element having a silver reflection film is achieved by the fusion of silver particles, unlike the conventional resin adhesion achieved by epoxy resin, the electric resistivity is low.

Still further, the present invention relates to a light-emitting device, wherein the above-described conductive material is used as a bonding material used for bonding a light-emitting element with a circuit board or a lead frame. In the light-emitting device, it is preferable that the circuit board includes at least one selected from the group consisting of a ceramic substrate containing aluminum oxide, aluminum nitride, zirconium oxide, zirconium nitride, titanium oxide, titanium nitride, or a mixture of the same; a metal substrate containing Cu, Fe, Ni, Cr, Al, Ag, Au, Ti, or an alloy of the same; a glass epoxy substrate; and a BT resin substrate.

Effects of the Invention

The method for producing a conductive material according to the present invention has an advantage that a conductive material having a low electric resistivity can be produced. Further, the method for producing a conductive material according to the present invention has an advantage that a conductive material can be produced simply at lower costs, using an inexpensive and stable conductive material composition.

DESCRIPTION OF THE INVENTION

<Light-Emitting Device>

Figure 1:
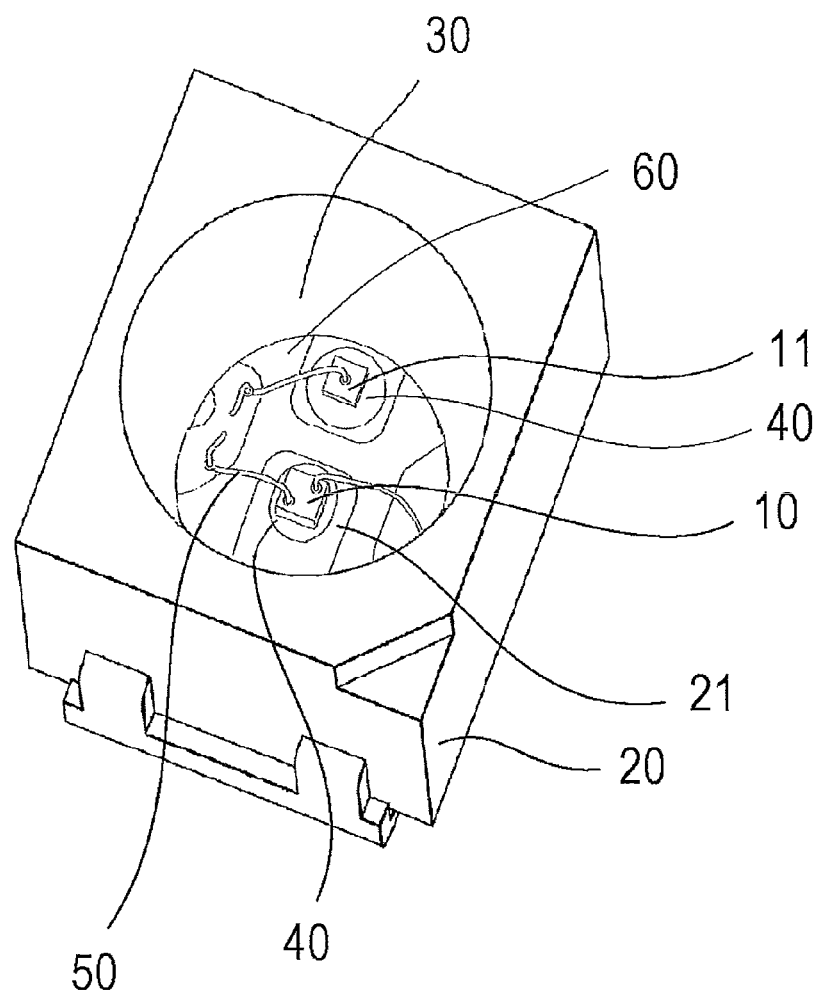
FIG. 1 is a schematic perspective view illustrating a light-emitting device.
Figure 2:
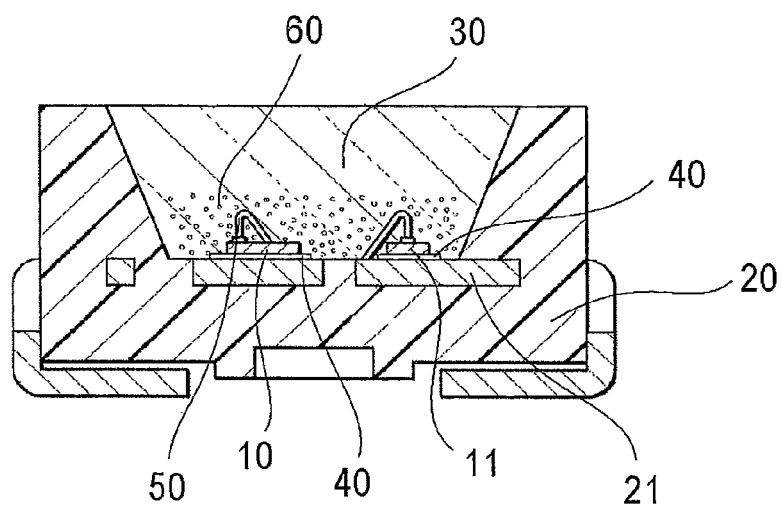
FIG. 2 is a schematic cross-sectional view illustrating the light-emitting device.

The following describes an example of a light-emitting device according to the present invention, while referring to the drawings. FIG. 1 is a schematic perspective view illustrating a light-emitting device, and FIG. 2 is a schematic cross-sectional view illustrating the light-emitting device.

The light-emitting device includes a light-emitting element 10, a package 20 on which the light-emitting element 10 is mounted, a sealing member 30 covering the light-emitting element 10, and a conductive material 40 used for the mounting of the light-emitting element 10. The package 20 is provided integrally with a pair of leads 21 having conductivity. The package 20 has a cup-form recess having a bottom face and a side face, and surfaces of the conductive leads 21 are exposed on the bottom face of the recess. The leads 21 are formed of iron, copper, or the like as a base material, and their surfaces are plated with silver. The light-emitting element 10 is bonded with one of the leads 21 via the conductive material 40, and is bonded with the other lead 21 via a wire 50. A protection element 11 such as a Zener diode may be mounted on the other lead 11. The protection element 11 also is mounted via the conductive material 40. The sealing member 30 may contain a fluorescent substance 60 that absorbs light from the light-emitting element 10 and subjects the light to wavelength conversion.

As the light-emitting element 10, an LED chip formed of a gallium nitride (GaN)-based semiconductor that emits blue light, an LED chip that emits ultraviolet light, or a laser diode is used. Alternatively, other than these, a nitride semiconductor such as InN, AlN, InGaN, AlGaN, or InGaAlN formed as a light-emitting layer on a substrate by the MOCVD method or the like may be used, for example. The light-emitting element 10 is mounted on the lead 21 via the conductive material 40. The light-emitting element includes a semiconductor formed by laminating an n-type semiconductor layer, an active layer, and a p-type semiconductor layer in the stated order on a substrate made of sapphire or the like. A back surface on a side opposite to of this semiconductor-laminated surface of the sapphire substrate is metalized with silver. The thickness of the silver provided on the sapphire substrate is not particularly limited, but the silver is preferably provided in a greater thickness since it leads to less delamination and a greater bonding strength. The thickness of the silver is preferably at least 250 nm or more, more preferably 360 nm or more, and most preferably 500 nm or more. Examples used as the substrate used for the light-emitting element and the semiconductor element include, not only a sapphire substrate, but also, a $SiO_2$ substrate, a GaN substrate, a ZnO substrate, and GaP substrate. Examples used as the light-emitting element 10 include, not only a light-emitting element having an n-side electrode and a p-side electrode on one surface, but also a light-emitting element having an n-side electrode on one surface and a p-side electrode on the back surface on the opposite side.

As the package 20, the package in which the leads 21 are provided integrally is used, but instead, another package provided with circuit wiring by plating or the like after the molding of the package may be used as well. The recess of the package 20 may be in any of various shapes such as a truncated cone shape that becomes wider toward the opening, a cylindrical shape, and a substantial cylindrical shape having recesses and projections on a side face. As a resin forming the package 20, an electrical insulating resin having excellent light stability and heat resistance is preferably used, examples of which include a thermoplastic resin such as polyphthalamide; a thermosetting resin such as an epoxy resin and a silicone resin; glass epoxy; and ceramics. Further, a white pigment such as titanium oxide may be mixed in such a resin so that light from the light-emitting element 10 should be reflected therefrom efficiently. A method for molding the package 20, any of the following methods, for example, may be used: the insert molding conducted with leads being provided in a die preliminarily; the injection molding; the extrusion molding; and the transfer molding.

The leads 21 are connected electrically with the light-emitting element 10, and may be plate-like leads inserted in the package 20, or a conductive pattern formed on, for example, a glass epoxy substrate or a ceramic substrate.

The leads 21 are formed by plating a base material with silver, the base material being principally composed of copper. As the base material, other materials than copper may be used, such as iron, aluminum, gold, or an alloy of these. Further, nickel or rhodium may be used as a priming coat, between the base material and silver. The thickness of this silver plating provided on the leads 21 is not particularly limited, but a greater thickness of the silver plating is preferred since it leads to less delamination and a greater bonding strength. The thickness of the silver plating is preferably at least 500 nm or more, more preferably 1 μm or more, and most preferably 3 μm or more.

The silver of the silver plating provided on the sapphire and the silver in the conductive material are metal-bonded with each other. Particles of the conductive material are fused with one another, and are metal bonded. This configuration makes it possible to decrease an electric resistivity.

The sealing member 30 efficiently transmits light from the light-emitting element 10 to the outside, and at the same time protects the light-emitting element 10 and the wire 50 from external forces, dust, etc. The sealing member 30 may contain the fluorescent substance 60, a light-diffusing member, etc. The fluorescent substance 60 may be anything as long as it absorbs light from the light-emitting element 10 and emits a fluorescent light having a waveform different from that of the light from the light-emitting element, and is preferably at least one selected from the following: a nitride phosphor or an oxynitride phosphor that is activated primarily by a lanthanoid element such as Eu or Ce; an alkaline earth halogen apatite phosphor, a halogenated alkaline earth metal borate phosphor, an alkaline earth metal aluminate phosphor, an alkaline earth silicate phosphor, an alkaline earth sulfide phosphor, an alkaline earth thiogallate phosphor, an alkaline earth silicon nitride phosphor, and a germanate phosphor that are activated primarily by a lanthanoid element such as Eu or a transition metal element such as Mn; a rare earth aluminate phosphor and a rare earth silicate phosphor that are activated primarily by a lanthanoid element such as Ce; and organic and organic complexes that are activated primarily by a lanthanoid element such as Eu. More preferably, $(Y, Gd)_3(Al, Ga)_5O_{12}$:Ce, $(Ca, Sr, Ba)_2SiO_4$:Eu, $(Ca, Sr)_2Si_5N_8$:Eu, $CaAlSiN_3$:Eu, or the like is used.

Not only for the above-mentioned light-emitting device, but also for a product in the other fields of electronic equipment that does not involve the emitting of light, the conductive material and the method for producing the same according to the present invention can be used when a semiconductor element is mounted.

Further, when the method for producing the conductive material according to the present invention may be applied to a glass epoxy substrate or a BT resin substrate, a conductive material in which a thermoplastic resin or a semi-cured thermosetting resin is molten by heating, thereby welded or welded-cured, can be applied on the substrate, whereby a wiring board is formed. For example, a composition of a conductive material is screen-printed on a glass epoxy substrate and is fused thereon by heating, whereby a silver circuit pattern can be formed simply.

<Conductive Material and Bonding State>

Figure 3:
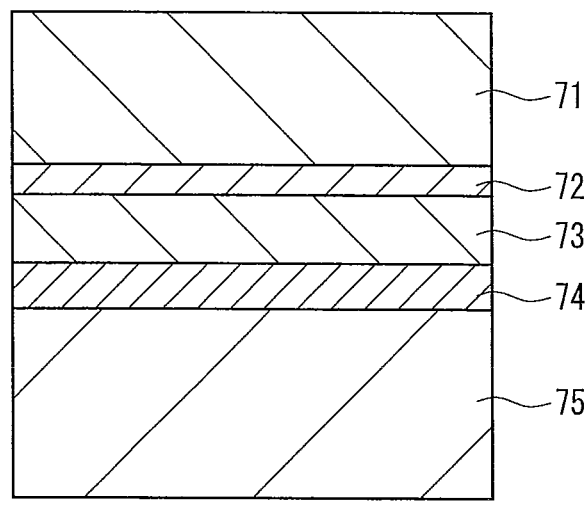
FIG. 3 is a diagram illustrating a bonding state of a conductive material.

The following explains a bonding state of a conductive material in which silver particles are fused to one another, while referring to drawings and photographs. It should be noted that the conductive material used herein is a conductive material composition containing no resin, for purposes of explanation. FIG. 3 is a schematic view illustrating a bonding state of a conductive material (containing no resin). In FIG. 3, a sapphire substrate 71 of the light-emitting element 10 is metalized with silver 72. A lead frame 75 formed principally of copper is provided with a silver plating 74. The sapphire substrate 71 is fused to the lead frame 75 via a conductive material 73. The silver 72 and the conductive material 73 are fused and metal-bonded with each other, and the conductive material 73 and the silver plating 74 are fused and metal-bonded.

Figure 4:
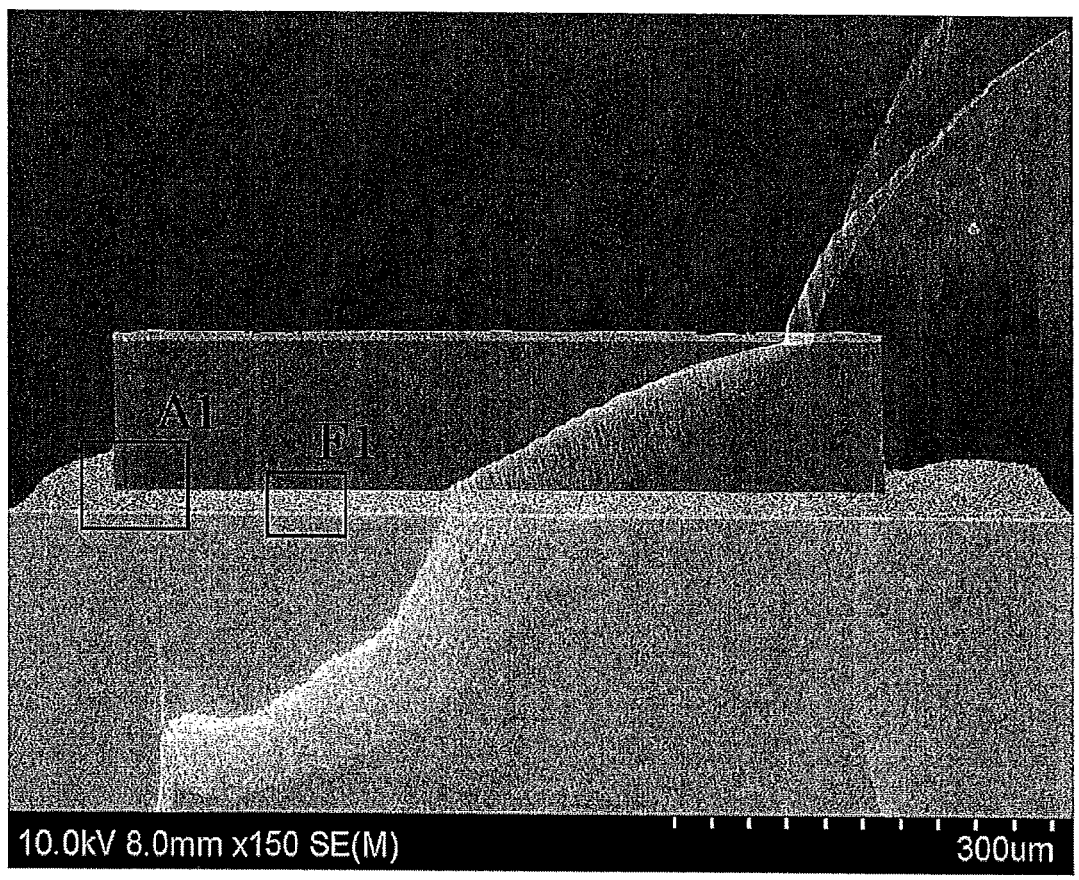
FIG. 4 is a cross-sectional photograph showing the bonding state of the conductive material.
Figure 5:
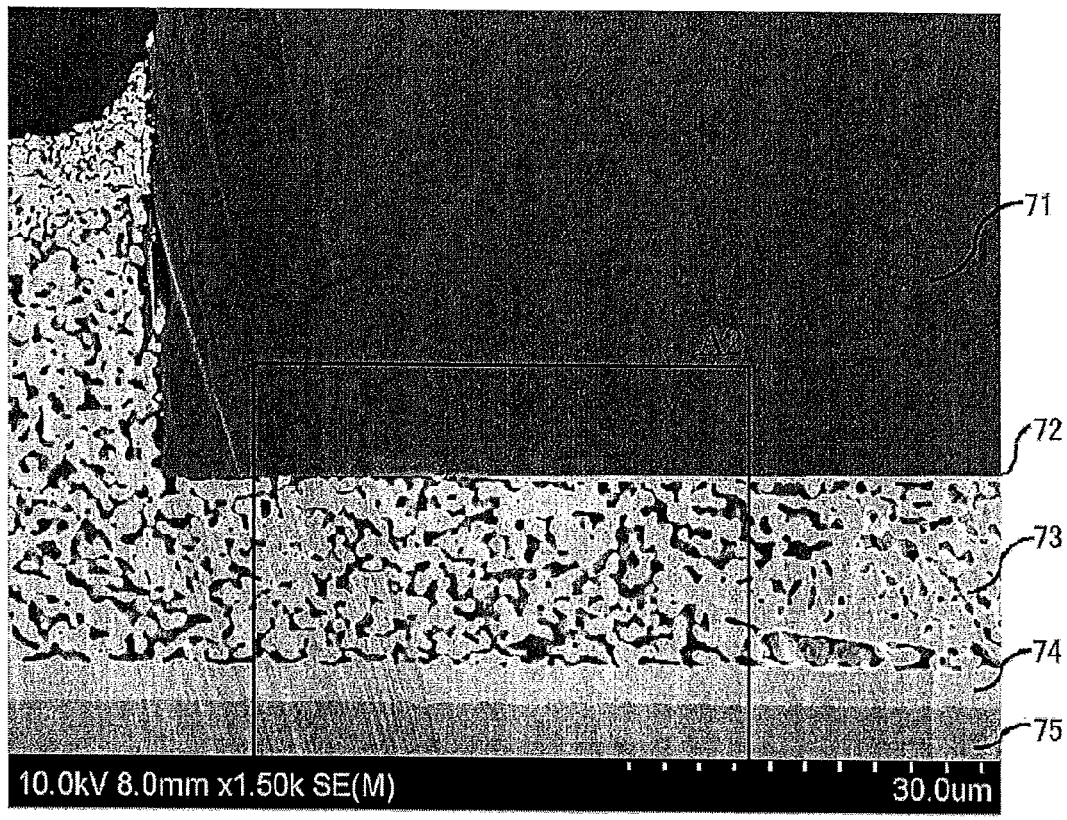
FIG. 5 is a magnified cross-sectional photograph of a portion A1 shown in FIG. 4.
Figure 6:
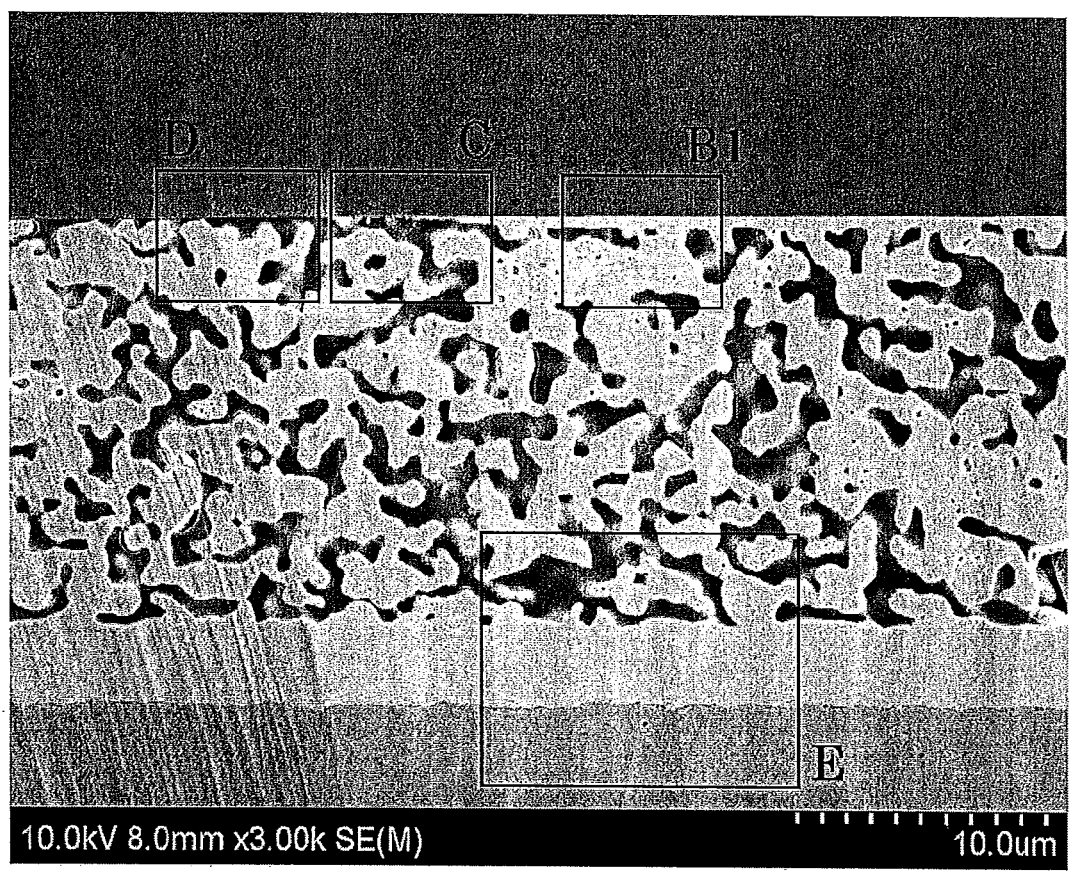
FIG. 6 is a magnified cross-sectional photograph of a portion A2 shown in FIG. 5.
Figure 7:
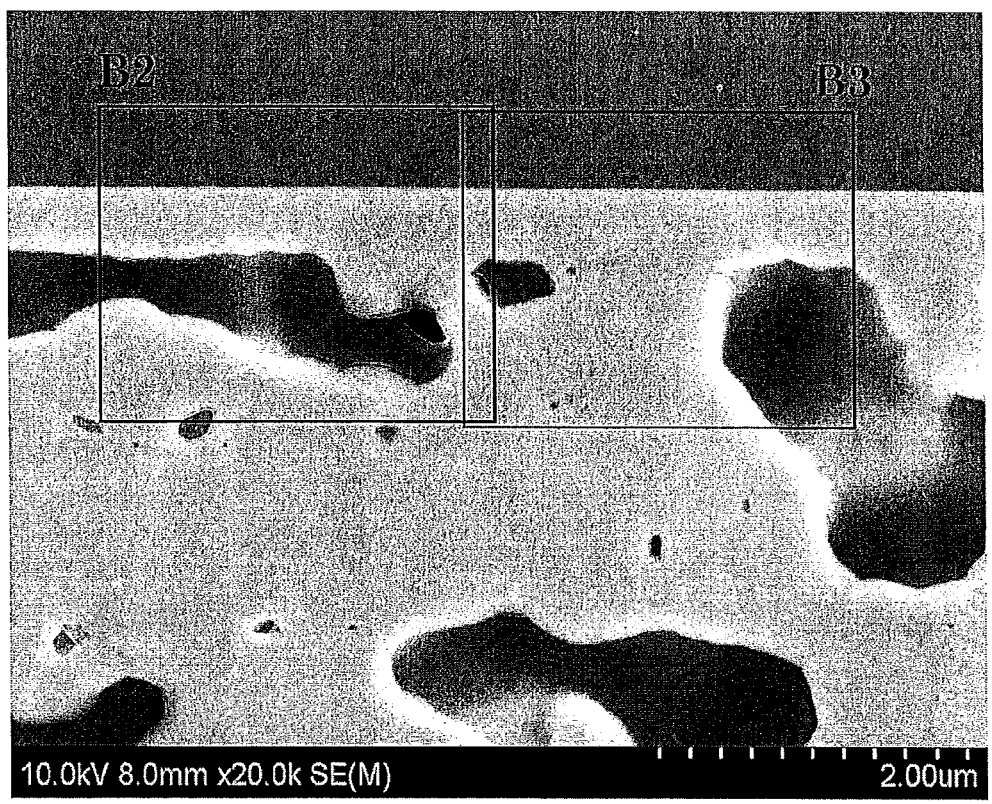
FIG. 7 is a magnified cross-sectional photograph of a portion B1 shown in FIG. 6.
Figure 8:
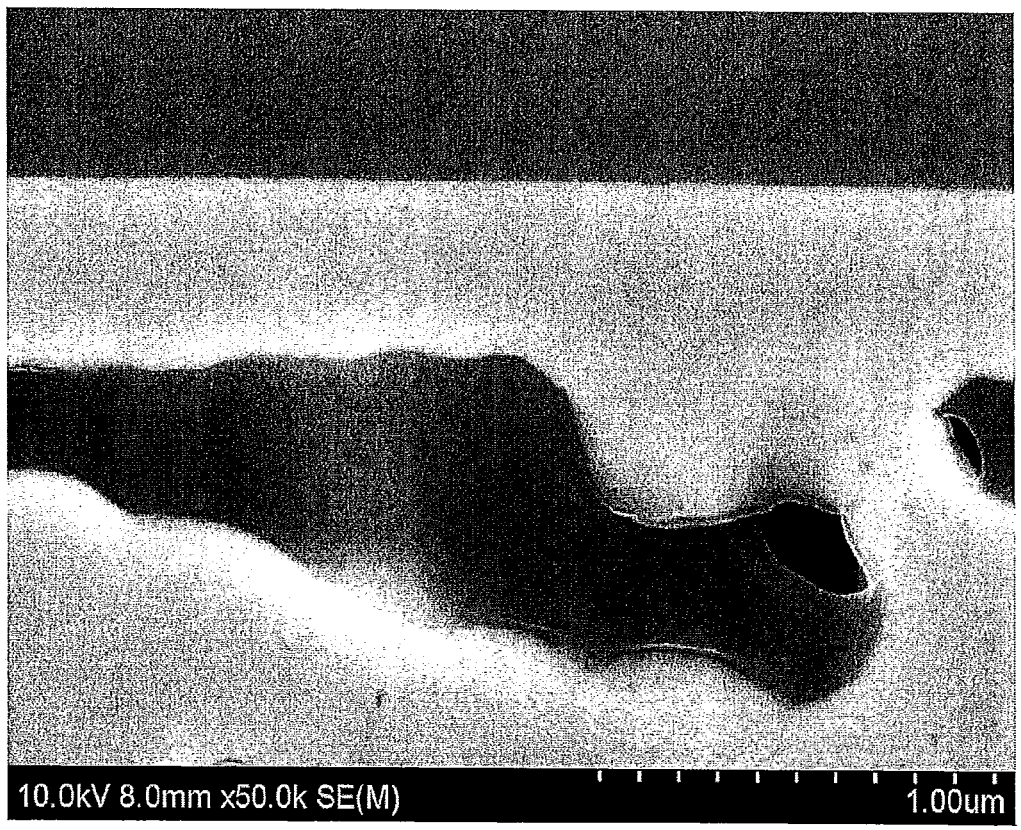
FIG. 8 is a magnified cross-sectional photograph of a portion B2 shown in FIG. 7.
Figure 9:
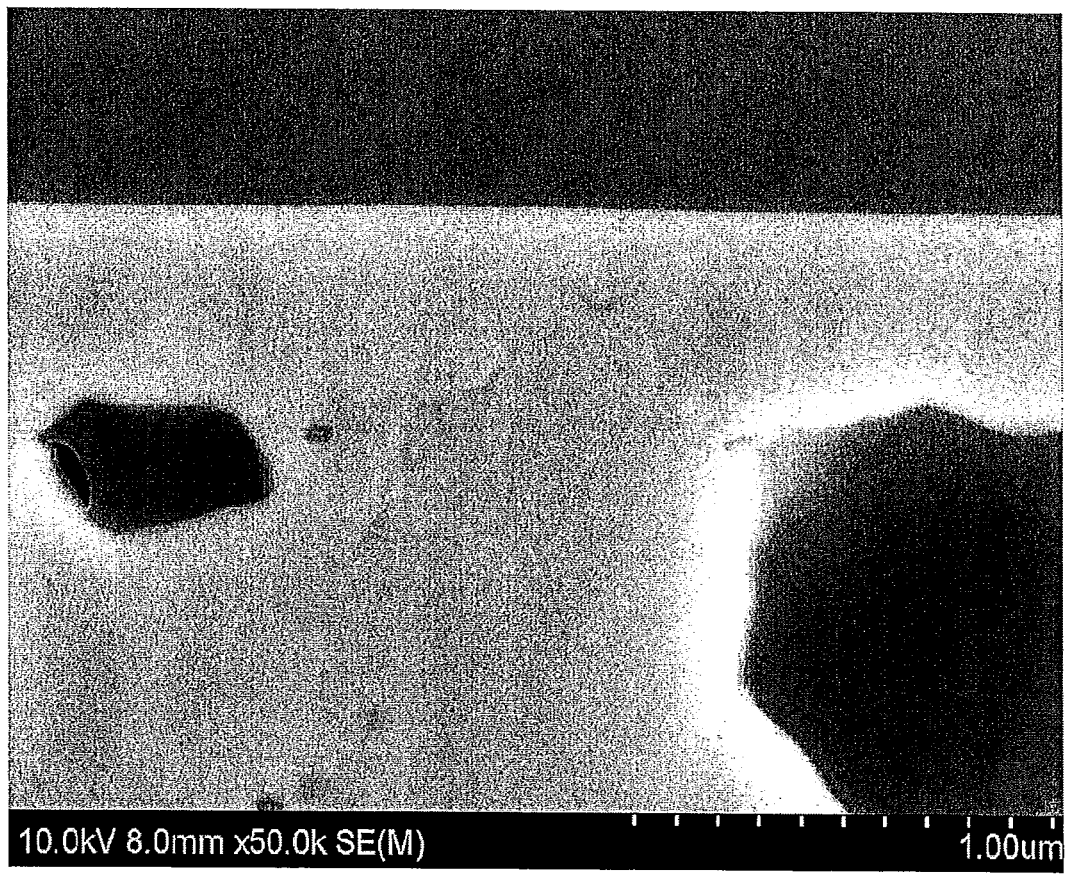
FIG. 9 is a magnified cross-sectional photograph of a portion B3 shown in FIG. 7.
Figure 10:
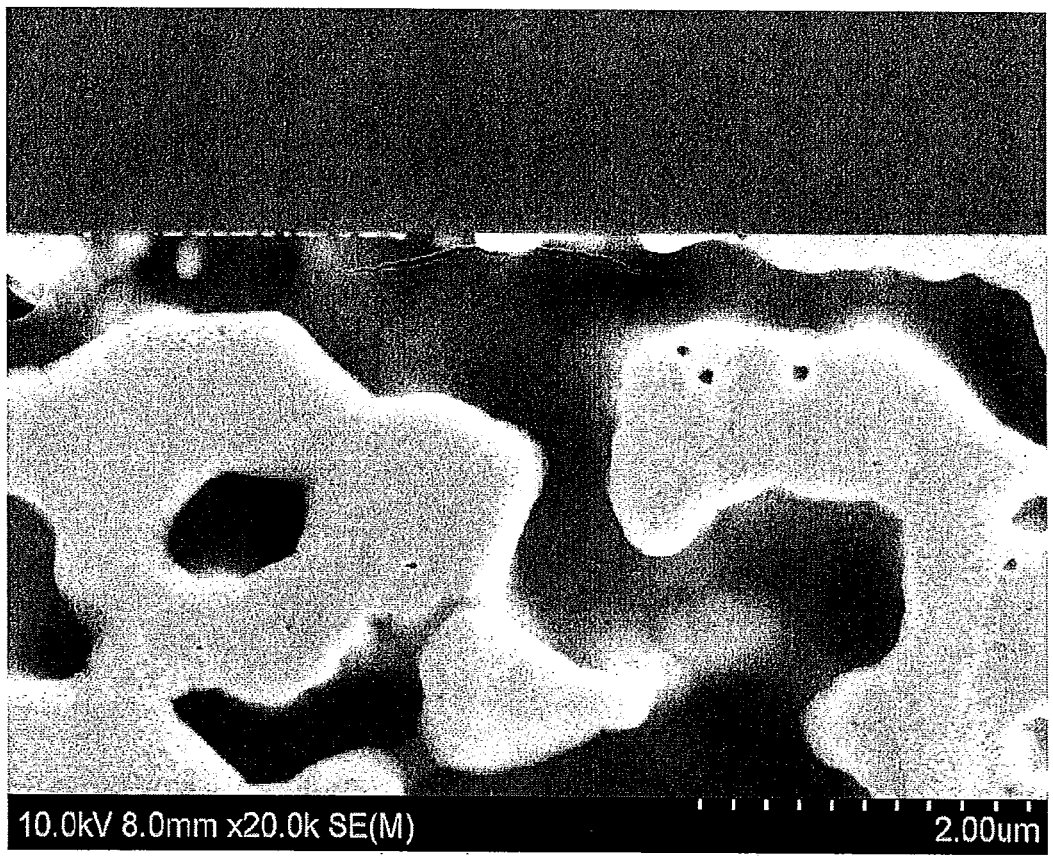
FIG. 10 is a magnified cross-sectional photograph of a portion C shown in FIG. 6.
Figure 11:
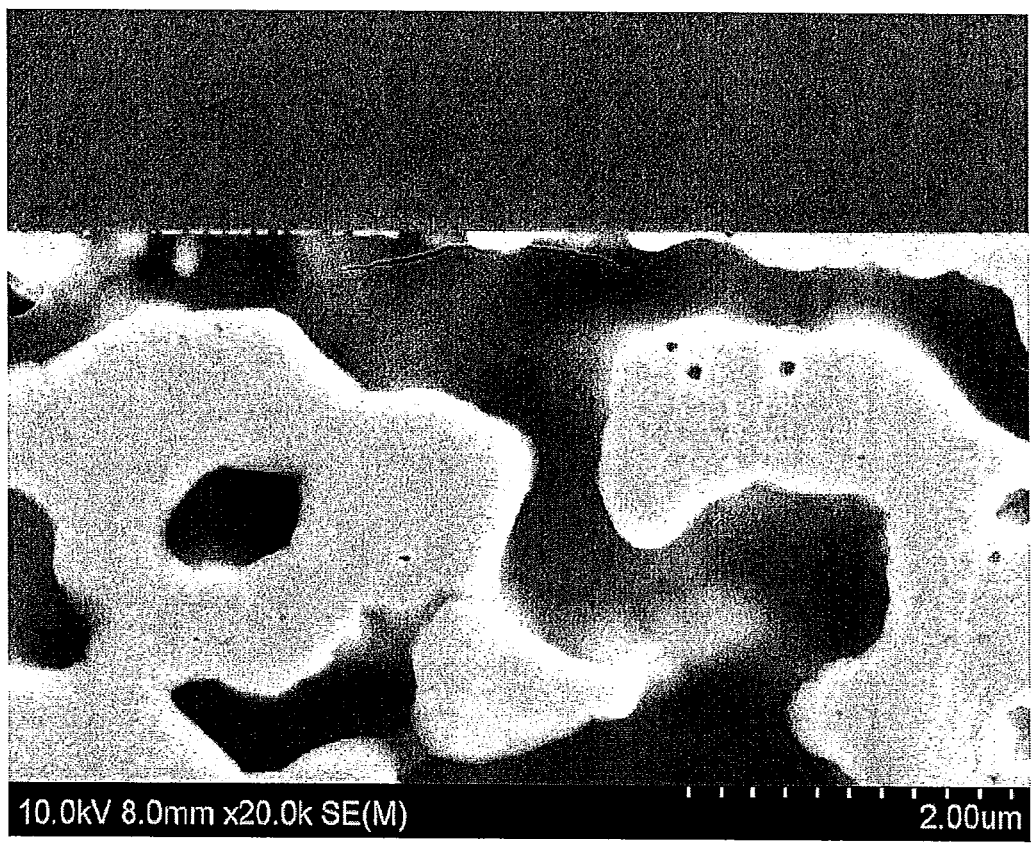
FIG. 11 is a magnified cross-sectional photograph of a portion D shown in FIG. 6.
Figure 12:
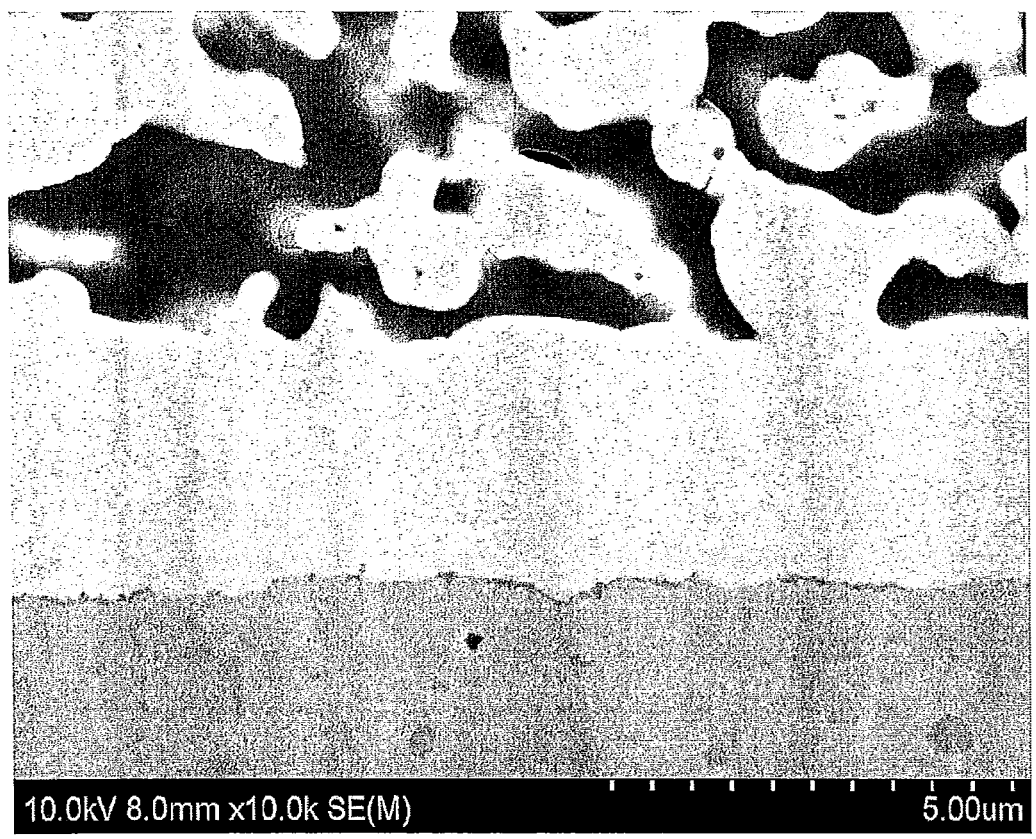
FIG. 12 is a magnified cross-sectional photograph of a portion E shown in FIG. 6.
Figure 13:
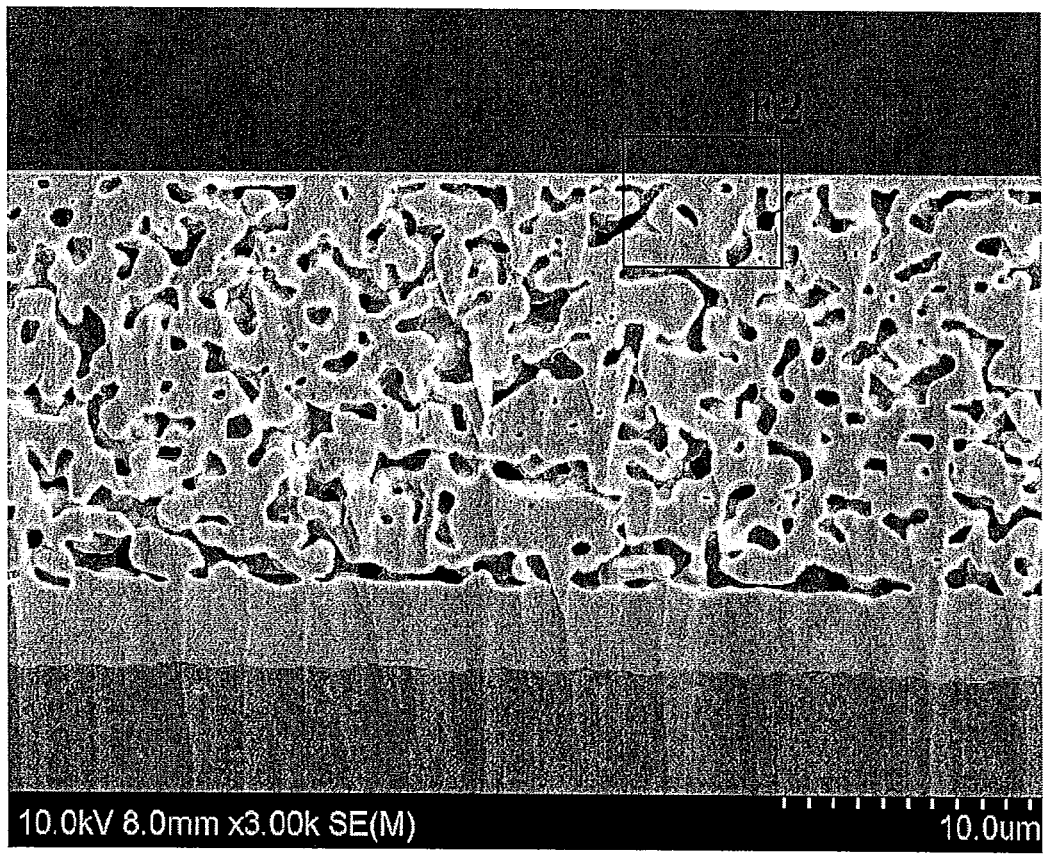
FIG. 13 is a magnified cross-sectional photograph of a portion F1 shown in FIG. 4.
Figure 14:
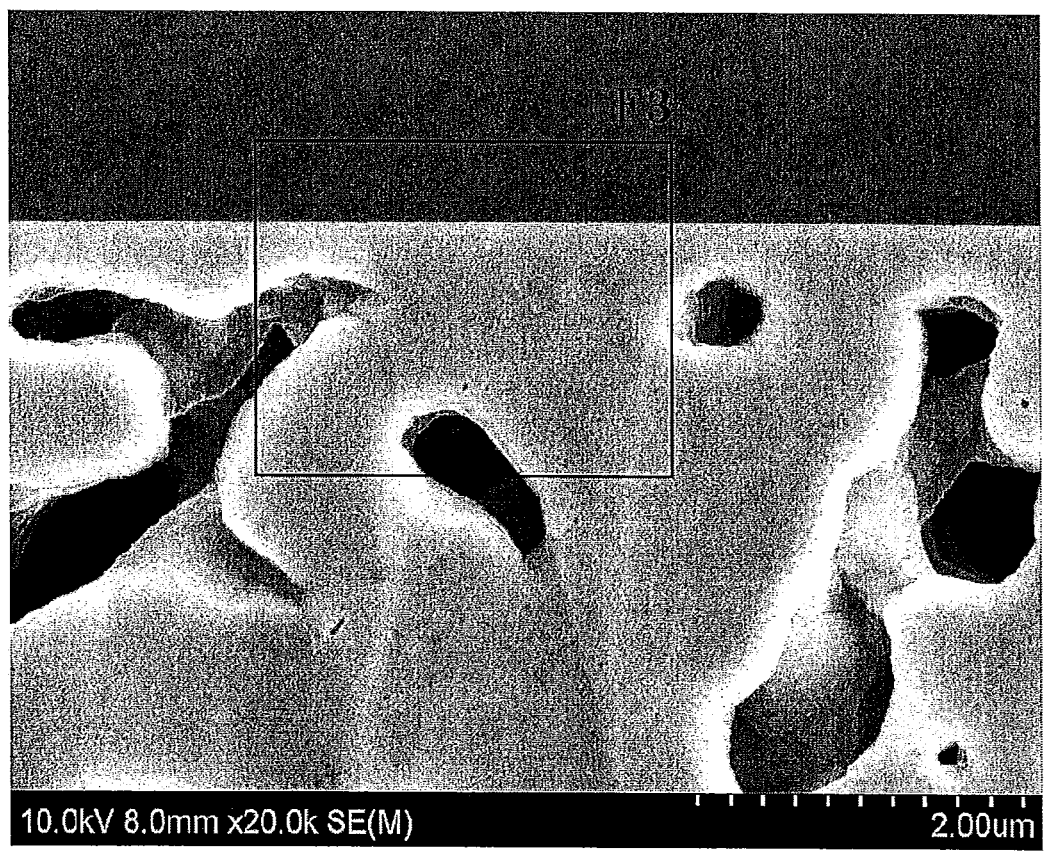
FIG. 14 is a magnified cross-sectional photograph of a portion F2 shown in FIG. 13.
Figure 15:
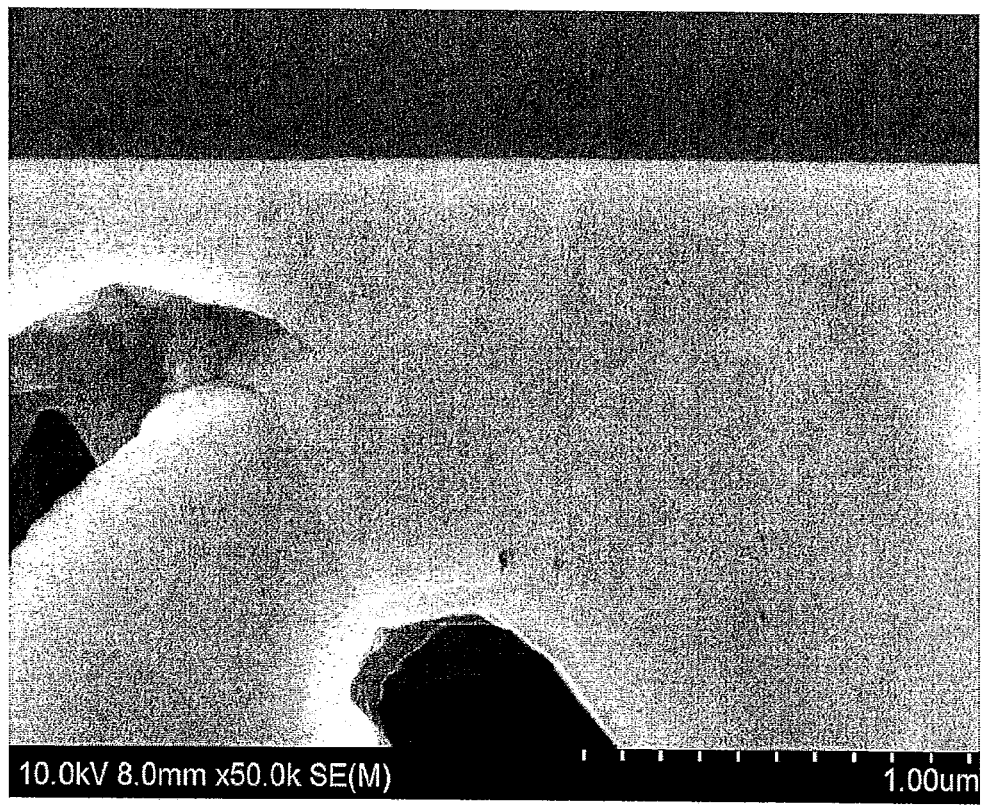
FIG. 15 is a magnified cross-sectional photograph of a portion F3 shown in FIG. 14.
Figure 16:
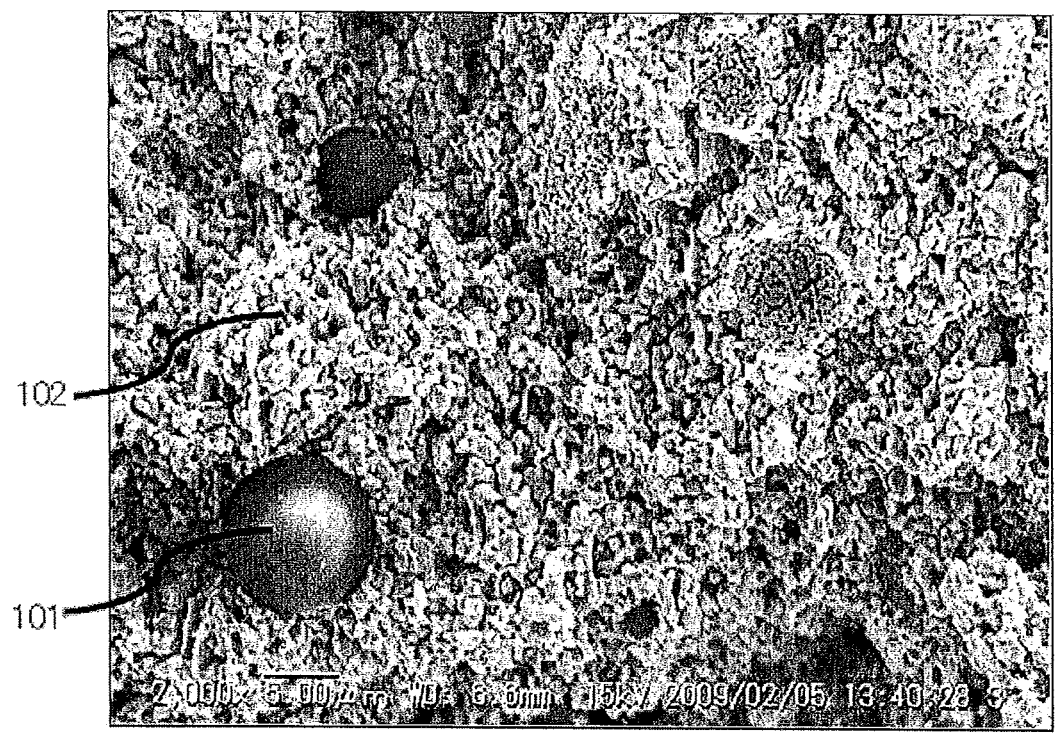
FIG. 16 is another cross-sectional photograph showing a bonding state of a conductive material.

FIG. 4 is a cross-sectional photograph showing the bonding state of the conductive material. FIG. 5 is a magnified cross-sectional photograph of a portion A1 shown in FIG. 4. FIG. 6 is a magnified cross-sectional photograph of a portion A2 shown in FIG. 5. FIG. 7 is a magnified cross-sectional photograph of a portion B1 shown in FIG. 6. FIG. 8 is a magnified cross-sectional photograph of a portion B2 shown in FIG. 7. FIG. 9 is a magnified cross-sectional photograph of a portion B3 shown in FIG. 7. FIG. 10 is a magnified cross-sectional photograph of a portion C shown in FIG. 6. FIG. 11 is a magnified cross-sectional photograph of a portion D shown in FIG. 6. FIG. 12 is a magnified cross-sectional photograph of a portion E shown in FIG. 6. FIG. 13 is a magnified cross-sectional photograph of a portion F1 shown in FIG. 4. FIG. 14 is a magnified cross-sectional photograph of a portion F2 shown in FIG. 13. FIG. 15 is a magnified cross-sectional photograph of a portion F3 shown in FIG. 14. FIG. 16 is another cross-sectional photograph showing a bonding state of a conductive material.

The portion A1 in FIG. 4 and the portion A2 in FIG. 5 illustrate a state of bonding of the silver-metalized parts and non-metalized parts of the sapphire substrate with the conductive material. The portion B1 of FIG. 6, the portion B2 in FIG. 7, and FIGS. 8 and 9 illustrate a state of bonding of the silver-metalized part 72 of the sapphire substrate 71 with the conductive material 73. The portion C in FIG. 6 and FIG. 10 illustrate a state of bonding of the silver-metalized part 72 of the sapphire substrate 71 with the conductive material 73. The portion D in FIG. 6 and FIG. 11 illustrate a state of bonding of the part not metalized with silver of the sapphire substrate 71 with the conductive material 73. The portion E of FIG. 6 and FIG. 12 illustrate a state of bonding of the silver-metalized part 74 of the lead frame 75 with the conductive material 73. The portion F1 in FIG. 4, the portion F2 in FIG. 13, the portion F3 in FIG. 14, and FIG. 15 illustrate a state of bonding of the silver-metalized part 72 of the sapphire substrate 71 with the conductive material 73. Thus, the silver 72 used for metalizing the sapphire substrate 71 and silver particles in the conductive material 73 are fused with each other, thereby being metal-bonded; so are the silver 74 used for metalizing the lead frame 75 and silver particles of the conductive material 73; and so are the silver particles in the conductive material 73.

FIG. 16 illustrates a bonding state of a conductive material containing a full-cured thermosetting resin in which silver particles are fused with one another. In FIG. 16, a thermosetting resin powder 101 having an average particle diameter of 0.1 µm to 10 µm is dispersed in fused silver particles 102.

The conductive material of the present invention is used for mounting a semiconductor element such as a light-emitting element or a protection element on a lead or the like plated with silver or a silver alloy. In the following, an average particle diameter (median diameter) is a value determined by the laser method, and a specific surface area determined by the BET method.

The inventors of the present invention found that when a conductive material composition containing at least one of a full-cured or semi-cured thermosetting resin and a thermoplastic resin, and silver particles is heated, silver particles are fused, whereby a conductive material can be obtained. This method for producing this conductive material makes it possible to provide a conductive material having a low electric resistivity. Further, the method for producing a conductive material according to the present invention makes it possible to produce a conductive material without a problem of generation of a gas by decomposition caused by heat of abrupt reaction. Still further, the method for producing a conductive material according to the present invention makes it possible to provide a conductive material with excellent elasticity and flexibility.

The method for producing a conductive material according to the present invention includes the step of heating a conductive material composition that contains either a full-cured or semi-cured thermosetting resin or a thermoplastic resin, and silver particles. In the present invention, when the conductive material composition is heated in the air or the like, the conductive material is shrinking as the silver particles are getting fused. To prevent this shrinkage of the conductive material, at least one of a full-cured or semi-cured thermosetting resin and a thermoplastic resin is mixed in the conductive material together with the silver particles. With such a resin being mixed therein, the shrinkage of the conductive material upon the heating of the conductive material composition is suppressed, and as a result, delamination of the conductive material from a semiconductor element can be decreased. It should be noted that in the present invention, the thermosetting resin and the thermoplastic resin make almost not contribution to the metal bonding, but function as stress relaxation material, and partially function as an adhesive for adhesion between the conductive material and an article.

Further, a method for producing a light-emitting device according to the present invention includes the steps of applying a conductive material composition onto a circuit board or a lead frame, the conductive material composition containing at least one of a full-cured or semi-cured thermosetting resin and a thermoplastic resin, as well as silver particles; disposing a light-emitting element onto the conductive material composition so as to obtain a light-emitting device precursor; heating the light-emitting device precursor in oxygen, ozone, or the air at 150° C. to 400° C. so as to obtain a light-emitting device including a conductive material as a bonding material between the wiring substrate or the lead frame, and the light-emitting element.

Another method for producing a light-emitting device according to the present invention includes the steps of applying a conductive material composition onto a circuit board or a lead frame, the conductive material composition containing at least one of a full-cured or semi-cured thermosetting resin and a thermoplastic resin, as well as silver particles; disposing a light-emitting element onto the conductive material composition so as to obtain a light-emitting device precursor; heating the light-emitting device precursor in a non-oxidizing atmosphere at 150° C. to 400° C. so as to obtain a light-emitting device having a conductive material as a bonding material between either the wiring substrate or the lead frame, and the light-emitting element. The silver particles here contain at least silver oxide.

[Silver Particles]

In the present invention, silver particles of one type having one same average particle diameter (median diameter) may be used, or alternatively a mixture of silver particles of two or more types having different average particle diameters, respectively, may be used. In the case where the silver particles are of one type, the average particle diameter (median diameter) is, for example, 0.1 µm to 15 µm, preferably 0.1 µm to 10 µm, and more preferably 0.3 to 5 µm. In the case where two or more types of silver particles are mixed, for example, average particle diameters (median diameters) of the two types are 0.1 µm to 15 µm and 0.1 µm to 15 µm in combination, preferably 0.1 µm to 15 µm and 0.1 µm to 10 µm in combination, and more preferably 0.1 µto 15 µm and 0.3 µm to 5 µm in combination. In the case where two or more types of silver particles are mixed, the content of silver particles having an average particle diameter (median diameter) of 0.1 µm to 15 µm is, for example, 70 wt % or more, preferably 80 wt % or more, and more preferably 90 wt % or more. This makes it possible to decrease an electric resistivity of an obtained conductive material. The average particle diameter (median diameter) of silver particles can be determined by the laser method.

Further, the silver particles have a specific surface area of, for example, 0.5 $m^2/g$ to 3 $m^2/g$, preferably, 0.6 $m^2/g$ to 2.8 $m^2/g$, and more preferably, 0.6 $m^2/g$ to 2.7 $m^2/g$. With this, an area where adjacent silver particles in the conductive material are in contact with each other can be increased. The specific surface area of the silver particles can be measured by a BET method.

Though the shape of a silver particle is not limited, examples of the shape include a spherical shape, a flat shape, and a polyhedral shape. The shapes of the silver particles having an average particle diameter (median diameter) in a certain range are uniform preferably. In the case where silver particles of two or more types with different average particle diameters (median diameters) that are mixed together are used, the respective types regarding the average particle diameters (median diameters) may have the same shape or different shapes. For example, when silver particles of two types having an average particle diameter (median diameter) of 3 µm and an average particle diameter (median diameter) of 0.3 µm are mixed, the silver particles having an average particle diameter (median diameter) of 0.3 µm may have a spherical shape each, while the silver particles having an average particle diameter (median diameter) of 3 µm may have a flat shape each.

[Full-cured or Semi-Cured Thermosetting Resin]

The thermosetting resin is not limited particularly, and at least one selected from the following may be used: epoxy resin, silicone resin, silicone modified resin, silicone modified resin, formaldehyde resin, phenol resin, melamine resin, urea resin, benzoguanamine resin, unsaturated polyester resin, alkyd resin, diallyl phthalate resin, polyurethane resin, cross-linked acrylic resin that is cross-linked to a high degree with thermosetting polyimide or the like (e.g., cross-linked polymethyl methacrylate resin), cross-linked polystyrene resin, etc. For an application that requires a die-shear strength and an adhesivity with an article, epoxy resin or polyurethane resin is preferred as a thermosetting resin, and for an application that requires long-term heat resistance, thermosetting polyimide is preferred as a thermosetting resin. For an application that requires light resistance, silicone resin or cross-linked acrylic resin is preferred as the thermoplastic resin. It should be noted that the "full-cured thermosetting resin" refers to a thermosetting resin completely cured by application of heat. As a method for curing the resin, a conventionally known curing method can be used. Further, "semi-cured" refers to a state achieved by suspension of the curing of a thermosetting resin at an intermediate stage, and from which the curing can be allowed to proceed further. It should be noted that "semi-cured thermosetting resin" is a thermosetting resin that can be molten by heating in the curing process.

The thermosetting resin may be coated with a white pigment such as titanium oxide or barium sulfate, or an inorganic filler such as alumina or silica. Such a coated, semi-cured, or full-cured thermosetting resin is preferred since the bonding strength can be maintained.

The thermosetting resin preferably has an average particle diameter of 0.1 μm to 10 μm, both inclusive, and more preferably 1 μm to 8 μm, both inclusive. The average particle diameter (median diameter) of the thermosetting resin can be determined by a laser method.

Further, the glass transition temperature (Tg) of the full-cured thermosetting resin is preferably −40° C. or lower, or 100° C. or higher, more preferably 110° C. or higher, and further preferably 150° C. or higher.

Further, the added amount of the full-cured thermosetting resin with respect to the weight of the silver particles is preferably more than 0 wt %, and not more than 5 wt %. With this amount, the delamination of a silver reflection film provided on an article can be reduced. The added amount is more preferably more than 0 wt % and not more than 3 wt %. The added amount of the semi-cured thermosetting resin with respect to the weight of the silver particles is preferably more than 0 wt % and not more than 10 wt %. With this, the delamination of a silver reflection film applied over an article can be reduced, and the adhesivity with the article can be imparted. The added amount is more preferably more than 0 wt % and not more than 6 wt %.

[Thermoplastic Resin]

The thermoplastic resin is not limited particularly, and one or more selected from the following may be used: homopolymers and copolymers such as polyethylene, polypropylene, polyvinyl chloride, polyvinylidene chloride, Teflon, polystyrene, polyvinyl acetate, ABS resin, AS resin, acrylic resin, polyamide, nylon, polyacetal, polycarbonate, modified polyphenylene ether, polybutylene terephthalate, polyethylene terephthalate, glass-fiber-reinforced polyethylene terephthalate, cyclic polyolefin, polyphenylene sulfide, polytetrafluoroethylene, polysulfone, polyethersulfone, amorphous polyarylate, liquid crystal polymer, polyether ether ketone, thermoplastic polyimide, polyamide imide, and the like. As the thermoplastic resin, acrylic resin is particularly preferred since fine particles to which various physical properties are imparted can be produced easily by radical polymerization.

More specifically, examples of the above-described thermoplastic resin include homopolymers, copolymers, and partially-cross-linked polymers of a resin that contains at least one of methacrylic acid, methyl methacrylate, ethyl methacrylate, propyl methacrylate, n-butyl methacrylate, i-butyl methacrylate, t-butyl methacrylate, 2-ethylhexyl methacrylate, lauryl methacrylate, lauryl-tridecyl methacrylate, isobornyl methacrylate, tridecyl methacrylate, cetyl-stearyl methacrylate, stearyl methacrylate, cyclohexyl methacrylate, benzyl methacrylate, 2-hydroxyethyl methacrylate, 2-hydroxylpropyl methacrylate, dimethylaminoethyl methacrylate, diethylaminoethyl methacrylate, glycidyl methacrylate, dicyclopentanyl methacrylate, dicyclopentenyl oxyethyl methacrylate, tetrahydrofurfuryl methacrylate, isodecyl methacrylate, octyl methacrylate, t-butylaminoethyl methacrylate, methacrylamide, ethylene dimethacrylate, pentacontahecta ethylene glycol dimethacrylate, 1,3-butylene dimethacrylate, ethylene glycol dimethacrylate, diethylene glycol dimethacrylate, triethylene glycol dimethacrylate, tetraethylene glycol dimethacrylate, 1,3-butylene glycol dimethacrylate, trimethylol propane trimethacrylate, allyl methacrylate, decaethylene glycol dimethacrylate, pentaerythritol tetramethacrylate, pentadecaethylene glycol dimethacrylate, diethylene glycol phthalate dimethacrylate, styrene, methyl styrene, α-methyl styrene, α-methyl styrene dimer, divinylbenzene, acrylic acid, methyl acrylate, ethyl acrylate, isobutyl acrylate, 2-ethylhexyl acrylate, monomers of salts of acrylic acid, isooctyl acrylate, isononyl acrylate, isobonyl acrylate, N,N-dimethylaminoethyl acrylate, 4-hydroxybutyl acrylate, t-butyl acrylate, dicyclopentenyl oxyethyl acrylate, 2-methoxyethyl acrylate, 3-methoxybutyl acrylate, lauryl acrylate, acrylonitrile, methacrylonitrile, acrylamide, 2-acrylamide-2-methyl propane sulfonic acid, allylamine, diallylamine, triallylamine, allyl alcohol, allyl chloride, sodium allyl sulfonate, allyl, methacrylate, 1,4-cyclohexane dimethanol monoacrylate, dipentaerythritol hexaacrylate, dipentaerythritol pentaacrylate, stearyl acrylate, tetraethylene glycol acrylate, tetrahydrofurfuryl acrylate, tripropylene glycol acrylate, trimethylol propane ethoxytriacrylate, trimethylol propane triacrylate neopentyl glycol diacrylate, neopentyl glycol hydroxy pivalate diacrylate, 1,9-nonane diol diacrylate, 2-hydroxyethyl acrylate, 4-hydroxybutyl acrylate glycidyl ether, 2-hydroxypropyl acrylate, phenoxyethyl acrylate, 1,4-butanediol diacrylate, 2-propenoic acid [2-[1,1-dimethyl-2-[(1-oxo-2-propenyl)oxy]ethyl]-5-ethyl-1,3-dioxane-5-yl]methyl ester, 1,6-hexanediol diacrylate, pentaerythritol triacrylate, 2-acryloyloxypropyl hydrogen phthalate, methyl-3-methoxy acrylate, vinyl acetate, methyl vinyl ketone, isopropenyl ketone, butadiene, isoprene, ethyl vinyl ether, isobutyl vinyl ether, itaconic acid, esters of itaconic acid, fumaric acid, esters of fumaric acid, and ethylene. Among these, a homopolymer, a copolymer, or a partially-cross-linked polymer of acrylic resin is preferred.

The thermoplastic resin has an average particle diameter of preferably 0.1 μm to 10 μm, and more preferably 1 μm to 8 μm. The average particle diameter (median diameter) of the thermoplastic resin can be determined by a laser method.

The thermoplastic resin has a glass transition temperature (Tg) or a melting point of preferably 100° C. or higher, and more preferably 110° C. or higher.

The added amount of the thermoplastic resin with respect to the weight of the silver particles preferably is more than 0 wt % and not more than 10 wt %. With this, the delamination of a silver reflection film applied over an article can be reduced, and the adhesivity with the article can be imparted. The added amount is more preferably more than 0 wt % and not more than 6 wt %.

[Inorganic Filler]

An inorganic filler may be added further to the conductive material composition. The inorganic filler may be added in an amount in a range of more than 0 wt % and not more than 80 wt %, with respect to the weight of the silver particles. Particularly, the inorganic filler is preferably contained in an amount of 20 wt % to 80 wt % with respect to the weight of silver particles. Even in the case where an inorganic filler is added, a conductive material thus obtained has a low electric resistivity of $5.0 \times 10^{-5}$ Ω·cm or less, and further, a coefficient of linear expansion thereof can be reduced so as to be smaller than that of silver. For example, in the case where an inorganic filler is added, a conductive material having $4.0 \times 10^{-6}$ Ω·cm to $5.0 \times 10^{-5}$ Ω·cm can be provided. The inorganic filler is preferably coated with silver. The thickness of the silver coating is not limited particularly as long as the inorganic filler particles as a whole have a particle diameter of 0.1 µm to 15 µm, but the thickness is preferably 0.01 µm to 1 µm since such an inorganic filler is prepared easily.

With the producing method of the present invention, since micron-order silver particles that do not need a special treatment can be fused as-is by heating, a conductive material can be produced easily. Still further, with the producing method of the present invention, a conductive material can be produced using easily-available and inexpensive silver particles. Still further, the producing method of the present invention has an advantage in the following: it is unnecessary to use a liquid-form adhesive, an unstable nano-particles of a silver compound, etc., as raw materials. Still further, the producing method of the present invention has an advantage in the following: since only portions at which the silver particles are in contact with one another are fused by heating, voids occur, whereby a film-form conductive material having considerable flexibility can be formed. It should be noted that a thermosetting resin or a thermoplastic resin is dispersed and gets into these voids. Still further, with the producing method of the present invention, since inexpensive materials such as silver, a thermosetting resin, and a thermoplastic resin can be used as raw materials, a further inexpensive conductive material can be provided by a simple method.

As the inorganic filler, an inorganic filler having a coefficient of linear expansion smaller than that of silver is preferred, and, for example, it is preferably formed of one or more selected from the group consisting of iron and alloys thereof, cobalt and alloys thereof, and nickel and alloys thereof. Examples used as the inorganic filler, other than those described above, include tungsten and alloys thereof, titanium and alloys thereof, molybdenum and alloys thereof, silicon and alloys thereof, aluminum and alloys thereof, copper and alloys thereof, alumina, silica, tin oxide, zinc oxide, titanium oxide, magnesium oxide, silicon nitride, boron nitride, aluminum nitride, potassium titanate, mica, calcium silicate, magnesium sulfate, barium sulfate, aluminum borate, glass flake, and fibers. An inorganic filler having a small electric resistivity is preferred, but since it tends to a greater coefficient of linear expansion, the added amount of such an inorganic filler has to be increased so as to allow an obtained conductive material to have a predetermined coefficient of linear expansion. In the case of an inorganic filler having a smaller coefficient of linear expansion, a small amount of the same may be added so as to allow an obtained conductive material to have a predetermined coefficient of linear expansion. Such an inorganic filler, however, is originally an insulator in some cases, such as silica, and in such a case, an obtained conductive material has a higher electric resistivity. Further, in the case of an inorganic filler having a coefficient of linear expansion not significantly different from that of silver, it does not generate thermal stress in a conductive material, and an cohesion strength of the conductive material does not decrease. From the viewpoint of balance of smallness between the electric resistivity and the coefficient of linear expansion, preferred examples of the inorganic filler are those formed of iron and alloys thereof, cobalt and alloys thereof, nickel and alloys thereof, tungsten and alloys thereof, and titanium and alloys thereof. Simply from the viewpoint of reducing costs, preferred examples of the inorganic filler are those formed of aluminum and alloys thereof, and copper and alloys thereof.

The inorganic filler preferably contains those in a particulate form having an average particle diameter (median diameter) of 0.1 µm to 15 µm, or those in a fiber form having a fiber diameter of 0.1 µm to 15 µm. The average particle diameter (median diameter) of the inorganic filler can be determined by a laser method.

As the inorganic filler, an inorganic filler of one type having one same average particle diameter (median diameter) may be used, or a mixture of inorganic fillers of two or more types having different average particle diameters, respectively, may be used. In the case where the inorganic filler is of one type, the inorganic filler preferably has an average particle diameter (median diameter) of 0.1 µm to 15 µm. This is because in the case where the inorganic filler has the above-described average diameter, it is possible to provide an excellent workability and to enable low-cost production. Further, in the case where the inorganic filler is of one type, the inorganic filler preferably has an average particle diameter (median diameter) of 0.1 µm to 10 µm. In the case where the inorganic fillers of two or more types are mixed, average particle diameters (median diameters) of the two types are, for example, 0.1 µm to 15 µm and 0.1 µm to 15 µm in combination, preferably 0.1 µm to 15 µm and 0.1 µm to 10 µm in combination, and more preferably 0.1 µm to 15 µm and 0.3 µm to 5 µm in combination. In the case where two or more types of the inorganic fillers are mixed, the content of the type having an average particle diameter (median diameter) of 0.1 µm to 15 µm is, for example, 70 wt % or more, preferably 80 wt % or more, and more preferably 90 wt % or more.

[Organic Solvent]

In the method for producing a conductive material, the conductive material composition preferably further contains an organic solvent having a boiling point of 300° C. or lower or water, wherein the silver particles, and either the thermosetting resin or the thermoplastic resin, are immersed in the organic solvent or water. The boiling point of the organic solvent is more preferably 150° C. to 250° C. In the case where an organic solvent having such a boiling point, it is possible to suppress variation in the viscosity of the conductive material composition at room temperature owing to volatilization of the organic solvent, thereby improving the workability and further, it is possible to allow the organic solvent or water to vaporize completely when heated. The organic solvent or water improves the conformability among the silver particles, the thermosetting resin, the thermoplastic resin, and an optional inorganic filler (preferably, when coated with silver, having a coefficient of linear expansion smaller than that of silver), thereby promoting the reaction between the silver particles and silver. In the method for producing a conductive material according to the present invention, the immersion of the silver particles in an organic solvent or water is preferred, since this allows the silver particles to be filled at a high concentration, without the workability being impaired, the conductive material has smaller shrinkage in volume after heated. Therefore, it is easy to estimate dimensions of the conductive material to be obtained. Further, the organic solvent preferably contains either a lower alcohol, or a lower alcohol having one or more substituents selected from the group consisting of lower alkoxy, lower alkoxy substituted with lower alkoxy, amino, and halogen. Such an organic solvent is preferred since it has high volatility, and therefore, residues of the organic solvent in the conductive material obtained after the conductive material composition is heated can be reduced.

Examples of the lower alcohol include a lower alcohol having a lower alkyl group with 1 to 6 carbon atoms, and 1 to 3, or preferably 1 to 2, hydroxy groups.

Examples of the lower alkyl group include straight-chain or branched-chain alkyl groups such as methyl group, ethyl group, n-propyl group, i-propyl group, n-butyl group, i-butyl group, sec-butyl group, t-butyl group, n-pentyl group, i-pentyl group, sec-pentyl group, t-pentyl group, 2-methylbutyl group, n-hexyl group, 1-methylpentyl group, 2-methylpentyl group, 3-methylpentyl group, 4-methylpentyl group, 1-ethylbutyl group, 2-ethylbutyl group, 1,1-dimethylbutyl group, 2,2-dimethylbutyl group, 3,3-dimetylbutyl group, and 1-ethyl-1-methylpropyl group.

Examples of a lower alcohol having a lower alkyl group with 1 to 6 carbon atoms and 1 to 3 hydroxy groups include methanol, ethanol, ethylene glycol, n-propanol, i-propanol, triethylene glycol, n-butanol, i-butanol, sec-butanol, t-butanol, n-pentanol, i-pentanol, sec-pentanol, t-pentanol, 2-methyl butanol, n-hexanol, 1-methyl pentanol, 2-methyl pentanol, 3-methyl pentanol, 4-methyl pentanol, 1-ethyl butanol, 2-ethyl butanol, 1,1-dimethyl butanol, 2,2-dimethyl butanol, 3,3-dimethyl butanol, and 1-ethyl-1-methyl propanol.

In the lower alcohol having one or more substituents selected from the group consisting of lower alkoxy, lower alkoxy substituted with lower alkoxy, amino, and halogen, the substituent is as follows.

Examples of the lower alkoxy include the lower alkyl group having a substitute of —O—. Examples of the lower alkoxy include methoxy, ethoxy, n-propoxy, i-propoxy, n-butoxy, i-butoxy, sec-butoxy, t-butoxy, and n-pentyloxy.

Examples of the lower alkoxy substituted with lower alkoxy include methoxyethoxy, and n-butoxyethoxy.

Examples of the halogen include fluorine, chlorine, bromine, and iodine.

Examples of the lower alcohol having one or more substituents selected from the group consisting of lower alkoxy, lower alkoxy substituted with lower alkoxy, amino, and halogen include methoxymethanol, 2-methoxyethanol, 2-ethoxyethanol, 2-chloroethanol, ethanolamine, diethylene glycol monobutyl ether (boiling point: 230° C.).

Though the added amount of the organic solvent is not limited particularly, since the necessary viscosity thereof varies with the methods of application of the conductive material composition. However, in order to reduce the porosity of the conductive material, the upper limit of the added amount of the same with respect to the weight of the silver particles is preferably 30 wt %.

[Metal Oxide]

As described above, the conductive material composition preferably further contain a metal oxide. As the metal oxide, for example, a silver oxide (e.g., AgO, Ag$_2$O, and Ag$_2$O$_3$) is used preferably, but any one of the following, for example, may be used also; chlorites (e.g., potassium chlorite, sodium chlorite, and copper chlorite) chlorates (e.g., potassium chlorate, barium chlorate, calcium chlorate, sodium chlorate, and ammonium chlorate); perchlorates (e.g., potassium perchlorate, sodium perchlorate, and ammonium perchlorate) bromates (e.g., potassium bromate, sodium bromate, and magnesium bromate); iodates (e.g., potassium iodate, sodium iodate, and ammonium iodate); inorganic peroxides (e.g., potassium peroxide, sodium peroxide, calcium peroxide, magnesium peroxide, barium peroxide, and lithium peroxide); nitrates (e.g., potassium nitrate, sodium nitrate, ammonium nitrate, uranyl nitrate, calcium nitrate, silver nitrate, iron (II) nitrate, iron (III) nitrate, copper (II) nitrate, lead (II) nitrate, and barium nitrate); permanganates (e.g., potassium permanganate, ammonium permanganate, sodium permanganate, zinc permanganate, magnesium permanganate, calcium permanganate, and barium permanganate) dichromates (e.g., ammonium dichromate, and potassium dichromate); periodates (e.g., sodium periodate) periodic acid (e.g., metaperiodic acid); chromium oxides (e.g., chromium trioxide); lead oxides (e.g., lead dioxide); oxides of iodine; nitrites (e.g., potassium nitrite, sodium nitrite, and calcium nitrite) hypochlorites (e.g., calcium hypochlorite) peroxodisulfates (e.g., potassium peroxodisulfate, and sodium peroxodisulfate); and peroxoborates (e.g., potassium peroxoborate, sodium peroxoborate, and ammonium peroxoborate).

Among these, the metal oxide is preferably one or more selected from the group consisting of AgO, Ag$_2$O, and Ag$_2$O$_3$. These metal oxides promote the oxidation reaction of the silver particles in the conductive material composition, thereby, as a result, allowing the metal bonding to be achieved at a relatively low temperature. These metal oxides are preferable since they are decomposed by heat upon heating, and thereafter, become silver. AgO as the metal oxide has a strong power of oxidation, and an added amount of the metal oxide therefore can be reduced. As a result, the electric resistivity of the obtained conductive material is decreased, and the mechanical strength of the conductive material is improved.

As the metal oxide, one type having one average particle diameter (median diameter) may be used, or a mixture of two types having different average particle diameters may be used. In the case where the metal oxide is of one type, the metal oxide preferably has an average particle diameter (median diameter) of 0.1 µm to 15 µm. This is because in the case where the metal oxide has the above-described average diameter, it is possible to provide an excellent workability and to enable low-cost production. Further, in the case where the metal oxide is of one type, the metal oxide preferably has an average particle diameter (median diameter) of 0.1 µm to 10 µm, and more preferably, 0.3 µm to 5 µm. In the case where the metal oxides of two or more types are mixed, average particle diameters (median diameters) of the two types are, for example, 0.1 µm to 15 µm and 0.1 µm to 15 µm in combination, preferably 0.1 µm to 15 µm and 0.1 µm to 10 µm in combination, and more preferably 0.1 µm to 15 µm and 0.3 µm to 5 µm in combination. In the case where two or more of the metal oxides are mixed, the content of the type having an average particle diameter (median diameter) of 0.1 µm to 15 µm is, for example, 70 wt % or more, preferably 80 wt % or more, and more preferably 90 wt % or more. The average particle diameter (median diameter) of the metal oxide can be determined by a laser method.

The content of the metal oxide is preferably 5 wt % to 40 wt % with respect to the weight of the silver particles, more preferably 5 wt % to 30 wt %, and further preferably about 10 wt %. This is because in the case where the content is in the foregoing range, the conductive material obtained has a high shear strength.

[Heating Conditions]

In the method for producing a conductive material according to the present invention, the heating is conducted preferably in an atmosphere of oxygen or ozone, or the air. However, in the case where a conductive material composition further containing a metal oxide, the heating may be conducted in any one of, not only the above-described atmospheres, but also a vacuum atmosphere and a non-oxygen atmosphere. The heating is preferably conducted in the air from the viewpoint of the production cost. However, in the case where a resin package on which a lead frame, a semiconductor element, etc. are to be mounted, and other peripheral members tend to be degraded by oxidation, the concentration of oxygen upon heating may be limited to such a level that the degradation by oxidation of the peripheral members should be minimized. In the case where a conductive material composition that does not further contain a metal oxide is used, the heating is carried out preferably in an atmosphere of oxygen or ozone, or the air, since the fusion of silver particles is promoted upon heating.

Though the heating may be conducted at a temperature in a range of 150° C. to 400° C., it is conducted preferably at a temperature in a range of 150° C. to 320° C. This is because metal bonding can be carried out at a temperature lower than a melting point of a resin package on which a semiconductor element or the like is mounted. The heating is conducted more preferably at a temperature in a range of 160° C. to 260° C., and further preferably at a temperature in a range of 180° C. to 220° C.

[Conductive Material]

The conductive material obtained by the method of the present invention, in which the silver particles are fused to one another, has a porosity of 2 vol % to 80 vol %. The porosity can be determined by a specific gravity method. Such a conductive material has an advantage of a high bonding strength.

The conductive material obtained by the method of the present invention preferably has an electric resistivity of $4.0 \times 10^{-5}$ Ω·cm or less. The electric resistivity is more preferably $1.6 \times 10^{-5}$ Ω·cm or less, and further preferably $8.5 \times 10^{-6}$ Ω·cm or less.

<Light-emitting Element>

Figure 17:
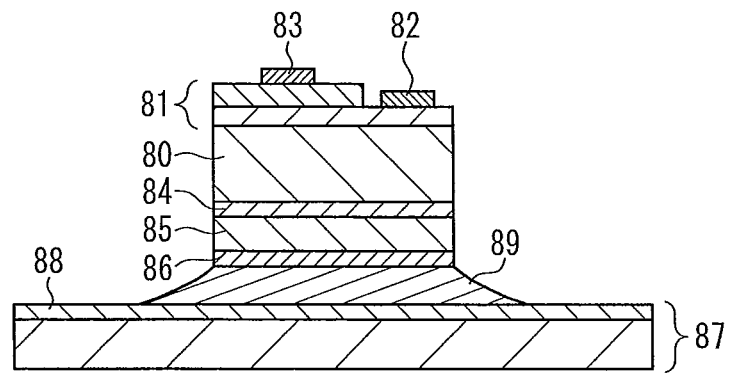
FIG. 17 is a schematic cross-sectional view illustrating a light-emitting device that is another embodiment.
Figure 18:
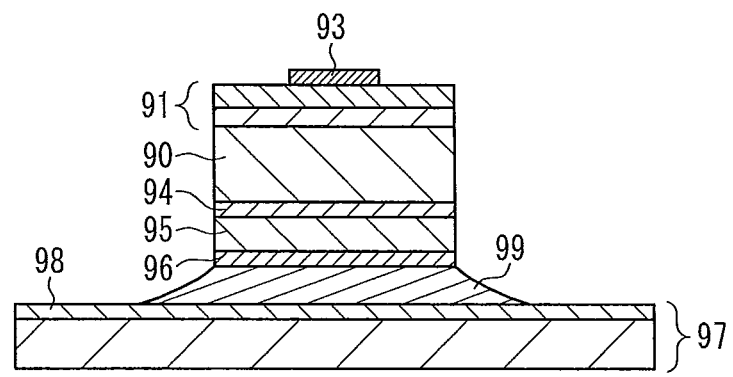
FIG. 18 is a schematic cross-sectional view illustrating a light-emitting device that is still another embodiment.

The following light-emitting element may be used in place of the above-described light-emitting element. FIG. 17 is a schematic cross-sectional view illustrating a light-emitting device that is another embodiment. FIG. 18 is a schematic cross-sectional view illustrating a light-emitting device that is still another embodiment.

A light-emitting element in the another embodiment has a configuration in which a semiconductor 81 is formed by laminating an n-type semiconductor layer, an active layer, and a p-type semiconductor layer in this order on a substrate 80 having translucency such as a sapphire substrate. The p-type semiconductor layer is etched so that the n-type semiconductor layer is exposed, and an n-side electrode 82 is formed on the n-type semiconductor layer, while a p-side electrode 83 is formed on the p-type semiconductor layer. A back surface of the substrate 80 opposite to the side on which the semiconductor 81 is laminated is metalized with silver 84 as a reflection film. On the surface metalized with silver 84, a buffer member 85 that is composed of a resin, an inorganic member, or a metal member may be provided additionally, and a surface of the buffer member 85 may be metalized with silver 86. If a silver film is provided on an outermost surface on the side on which a light-emitting element is mounted, a plurality of buffer members may be laminated. Though the thickness of the silver 86 provided on the outermost surface is not limited particularly, a greater thickness of the silver 86 leads to less delamination and a greater bonding strength. A lead frame 87 is formed principally of copper, and is provided with a silver plating 88. This light-emitting element is mounted on the lead frame 87 via a conductive material 89. The silver 86 of the light-emitting element and the conductive material 89 are fused and metal-bonded, and the silver plating 88 of the lead frame 87 and the conductive material 89 are fused and metal-bonded. As will be described later, the strength of bonding of the sapphire substrate with respect to the conductive material of silver is smaller than the strength of bonding of a ZnO or GaP substrate with respect to the conductive material of silver, and therefore, the bonding strength between the light-emitting element and the conductive material can be increased by providing the buffer member 85, whereby the delamination therebetween is decreased.

A light-emitting element of still another embodiment may have, not a configuration in which a p-side electrode and an n-side electrode are provided on surfaces on the same side as described above, but a configuration in which a p-side electrode 93 and an n-side electrode (equivalent to 96) are provided on surfaces on different sides, respectively. A semiconductor 91 is formed by laminating an n-type semiconductor layer, an active layer, and a p-type semiconductor layer in this order on a translucent substrate 90. The p-side electrode 93 is formed on the p-type semiconductor layer side, and an n-side electrode (equivalent to 96) is formed on a side of the lower surface of the substrate 90. The lower surface of the substrate 90 is metalized with silver 94, whereby a reflection film is formed. On the surface metalized with silver 94, a conductive buffer member 95 such as a metal member may be provided additionally, and a surface of the buffer member 95 may be metalized with silver 96. If a silver film is provided on an outermost surface on the side on which a light-emitting element is mounted, a plurality of buffer members may be laminated. Though the thickness of the silver 96 provided on the outermost surface is not limited particularly, a greater thickness of the silver 96 leads to less delamination and a greater bonding strength. A lead frame 97 is formed principally of copper, and is provided with a silver plating 98. This light-emitting element is mounted on the lead frame 97 via a conductive material 99. The silver 96 of the light-emitting element and the conductive material 99 are fused and metal-bonded, and the silver plating 98 of the lead frame 97 and the conductive material 99 are fused and metal-bonded.

It should be noted that a surface of a portion of the light-emitting element to be fused with the conductive material is preferably coated with silver, or an alloy of silver; however, alternatively, it may be coated with Pt, an alloy of Pt, Sn, an alloy of Sn, gold, an alloy of gold, copper, an alloy of copper, Rh, an alloy of Rh, or the like. The reason is as follows: since the surface part of the portion on which the conductive material is to be applied is made principally of silver, if the light-emitting element is coated with silver, the silver of the element has excellent fusibility with the surface part of the portion on which the conductive material is to be applied. The coating can be carried out by plating, vapor deposition, sputtering, spreading, or the like.

<Circuit Board, Lead Frame>

The circuit board used in a light-emitting device or an electronic device is not limited particularly, as long as a conductive material composition can be applied over a surface thereof. Examples of the circuit board include a ceramic substrate containing aluminum oxide, aluminum nitride, zirconium oxide, zirconium nitride, titanium oxide, titanium nitride, or a mixture of the same; a metal substrate containing Cu, Fe, Ni, Cr, Al, Ag, Au, Ti, or an alloy of the same; a glass epoxy substrate; a BT resin substrate; a glass substrate; a resin substrate; and paper. Using such a circuit board, the device has excellent heat resistance. Besides, according to this producing method, a temperature for heating may be low. Therefore, a circuit board vulnerable to heat, such as that made of a thermosetting resin or a thermoplastic resin, can be used.

In the case where the circuit board is a ceramic substrate, when a light-emitting element is made of a single crystal having a small coefficient of linear expansion, it is possible to prevent thermal stress from being applied to bonded portions at which the circuit board and the light-emitting element are bonded. Further preferable as the circuit board is a ceramic substrate containing aluminum oxide. This is because the costs of the light-emitting device can be reduced.

In the present invention, used as the lead frame in a light-emitting device or an electronic device is, for example, a metal frame made of copper, iron, nickel, chromium, aluminum, silver, gold, titanium, or an alloy of the same. Among these metals, copper, iron, or an alloy of the same is preferable. As the lead frame, a lead frame made of a copper alloy is more preferable in a light-emitting device that requires heat dissipation, and a lead frame made of an iron alloy is more preferable in a light-emitting device that requires reliability of bonding with a semiconductor element.

A surface of a portion of the circuit board or the lead frame on which the conductive material is to be applied is preferably coated with silver, an oxide of silver, an alloy of silver, or an alloy of an oxide of silver, but alternatively, it may be coated with Pt, an alloy of Pt, Sn, an alloy of Sn, gold, an alloy of gold, Cu, an alloy of Cu, Rh, an alloy of Rh, or the like. The reason is as follows: since the surface part of the portion on which the conductive material is to be applied is made principally of silver, if the light-emitting element is coated with silver oxide, the silver oxide of the element has excellent fusible properties with the surface part of the portion on which the conductive material is to be applied. The coating can be carried out by plating, vapor deposition, sputtering, spreading, or the like.

<Light-emitting Device, Electronic Device>

Further, an electronic device of the present invention is an electronic device containing the conductive material obtained by the producing method of the present invention, wherein the conductive material is used as a material for electric connecting, component electrodes, die attach materials, or microbumps. The electronic device, obtained using the foregoing conductive material, has an advantage of a sufficiently small electric resistivity, and less variation in the electric resistivity with time. The electronic device, obtained using the foregoing conductive material, has excellent thermal compatibility with silicon or a compound semiconductor as a semiconductor element, and hence has an advantage of high reliability, without a possibility of delamination of bonded parts owing to a thermal shock.

Further, a light-emitting device of the present invention is a light-emitting device in which the conductive material according to the present invention is used as a bonding material, and a circuit board or a lead is metal-bonded with a light-emitting element. Examples of a method for bonding a light-emitting element and a circuit board, etc., include, generally, a method using an organic bonding material such as an insulation adhesive or a conductive adhesive in which a conductive metal filler is dispersed, and a method using a metal bonding material such as a high-temperature lead solder or AuSn eutectic. The method using an organic bonding material, as described above, has a problem in that the organic component in the organic bonding material degrades due to light or heat, and as a result causes the color or the strength to decrease, that is, a problem of decrease in the lifetime of the light-emitting device. The method using a metal bonding material has a problem in that a plastic member of a light-emitting device significantly degrades due to heat since it is exposed to a high temperature over 300° C. upon bonding. In contrast, in the method for producing the conductive material according to the present invention, the conductive material composition contains silver particles, which are a metal, as a principal component, and does not need a large amount of an adhesive leading to an increase in electric resistivity. As a result, almost no resin component is present on a surface of the obtained conductive material. Therefore, the conductive material obtained is hardly affected by light or heat. Besides, since a temperature required upon bonding in the case where the conductive material is used can be in a range of 150° C. to 400° C., preferably 150° C. to 320° C., it is possible to prevent a plastic member in a light-emitting device from degrading due to heat. Furthermore, the method for producing a conductive material according to the present invention does not cause a problem of a gas generated by decomposition caused by heat of abrupt reaction. Therefore, the conductive material obtained, in which the formation of irregular voids is suppressed, is excellent as a bonding material.

A light-emitting device obtained by using the conductive material according to the present invention has an advantage in that it has a sufficiently small electric resistivity, and less variation in the electric resistivity with time. Further, using the conductive material according to the present invention, the light-emitting device obtained has an advantage in that the degradation and discoloration of the circuit board or the lead frame is suppressed. Still further, the light-emitting device according to the present invention has advantages in that light output therefrom has less decrease with time even if the device is driven for a long time, and that the device has long lifetime.

As described above, a method for producing a light-emitting device according to the present invention includes the steps of applying a conductive material composition onto a circuit board or a lead frame, the conductive material composition containing at least one of a full-cured or semi-cured thermosetting resin and a thermoplastic resin, as well as silver particles; disposing a light-emitting element onto the conductive material composition so as to obtain a light-emitting device precursor; and heating the light-emitting device precursor in an atmosphere of oxygen or ozone, or the air at 150° C. to 400° C. so as to obtain a light-emitting device including a conductive material as a bonding material between the light-emitting element and the wiring substrate or the lead frame.

Further, as described above, another method for producing a light-emitting device according to the present invention includes the steps of applying a conductive material composition onto a circuit board or a lead frame, the conductive material composition containing at least one of a full-cured or semi-cured thermosetting resin and a thermoplastic resin, as well ad silver particles; disposing a light-emitting element onto the conductive material composition so as to obtain a light-emitting device precursor; and heating the light-emitting device precursor in a non-oxidizing atmosphere at 150° C. to 400° C. so as to obtain a light-emitting device including a conductive material as a bonding material between the light-emitting element and either the wiring substrate or the lead frame. The silver particles here contain at least silver oxide.

In the method for producing the light-emitting device, the step for applying a conductive material composition over a substrate is not limited particularly as long as the conductive material composition can be applied over a surface of a substrate, but the step may be carried out by printing, coating, or the like. Examples of the printing include screen printing, offset printing, ink jet printing, flexographic printing, dispenser printing, gravure printing, stamping, dispensing, squeeze printing, silk screen printing, spraying, and brush coating. Among these, screen printing, stamping, or dispensing is preferable. The conductive material composition is applied in a thickness of, for example, 3 µm to 100 µm, preferably 3 µm to 50 µm, and more preferably 5 µm to 20 µm. Particularly for a light-emitting element having a size of 0.5 mm square or smaller, stamping or dispensing is preferable, between which stamping is more preferable. This is because the stamping makes it possible to apply the composition accurately to fine area, and furthermore, to increase the working speed.

The method for producing the light-emitting device may further include the step of laying metal wiring between electrodes of the light-emitting element and a wiring portion of the circuit board or the lead frame. Here, the metal wiring is preferably made of gold, silver, copper, or aluminum, and more preferably, gold. In the case where the metal wiring is made of gold, a stable bonding property is achieved, and corrosion less likely occurs.

Further, the method for producing the light-emitting device may further include the step of sealing the light-emitting device with a resin, an air-tight cover, or a non-air-tight cover. Examples of the resin used in the sealing step include epoxy resins, phenol resins, acrylic resins, polyimide resins, silicone resins, urethane resins, and thermoplastic resins. Among these, silicone resins are preferable, since a light-emitting device having excellent heat resistance and light resistance as well as long lifetime can be produced. As a material for the air-tight cover or the non-air-tight cover, the following can be used: inorganic glass; polyacrylic resin; polycarbonate resin; polyolefin resin; and norbornene resin. Among these, inorganic glass is preferable, since a light-emitting device having excellent heat resistance and light resistance as well as long lifetime can be produced.

EXAMPLE

Figure 19:
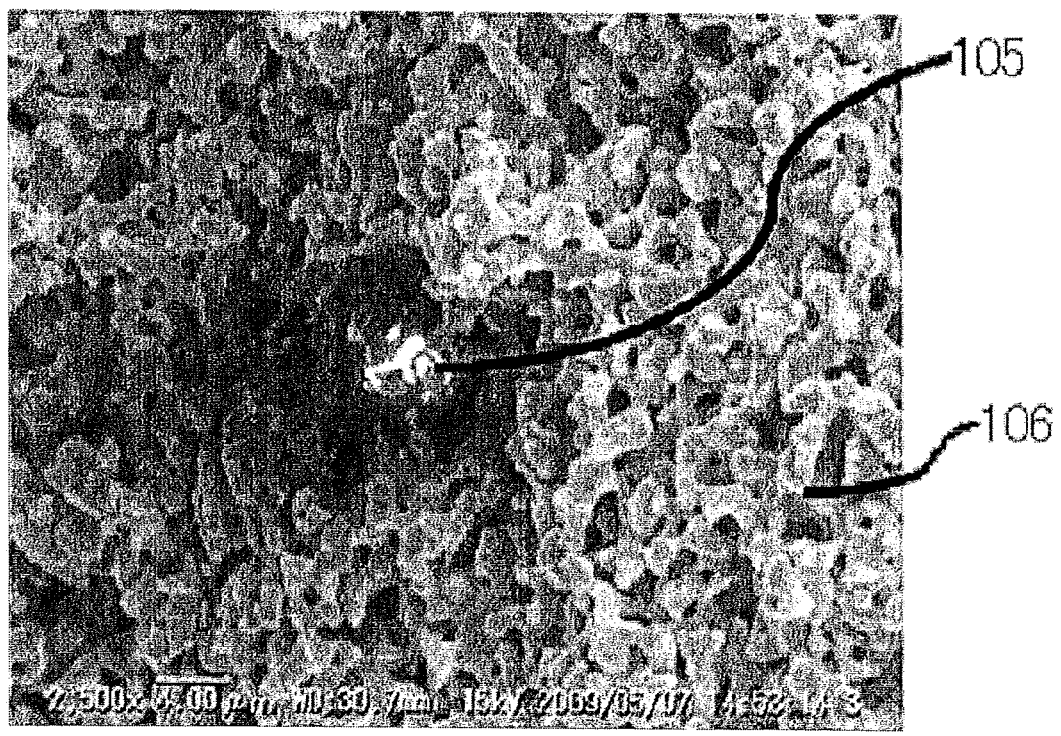
FIG. 19 is a photograph showing a bonding state of a conductive material of Example 18.
Figure 20:
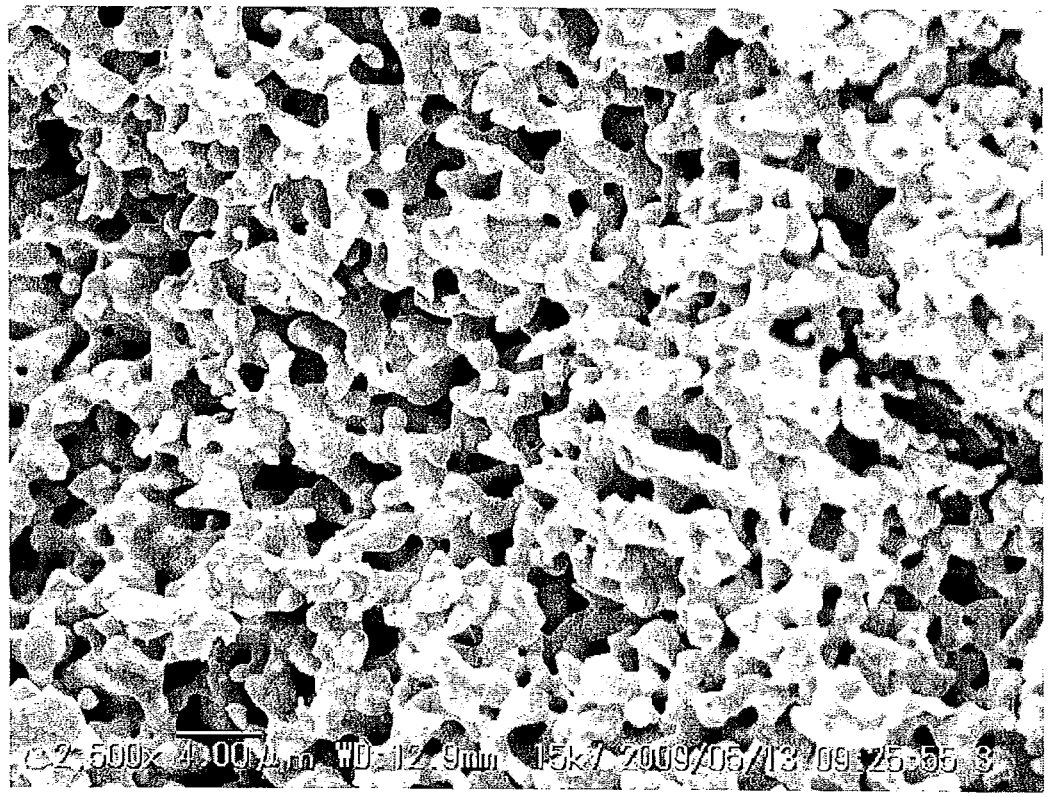
FIG. 20 is a photograph showing a bonding state of a conductive material of Example 23.

The following will explain the conductive material and the method for producing the conductive material according to the present invention, while referring to Examples, Comparative Examples, and Reference Examples. FIG. 1 is a schematic perspective view illustrating a light-emitting device according to Examples. FIG. 2 is a schematic cross-sectional view illustrating the light-emitting device according to Examples. FIG. 19 is a photograph showing a bonding state of a conductive material of Example 18. FIG. 20 is a photograph showing a bonding state of a conductive material of Example 23. Descriptions are omitted as to matters substantially identical to those described in the description of Embodiments.

Reference Examples 1 to 6

In Reference Examples 1 to 6, shear strengths of conductive materials obtained from silver particles were determined, and a particle composition for silver particles that provides an excellent shear strength was found. The silver particles used are as follows: product name: "AgC-239" (produced by Fukuda Metal Foil & Powder Co., Ltd.), which has an average particle diameter (median diameter) of 2.0 to 3.2 μm, and a specific surface area of 0.6 to 0.9 $m^2/g$; and, product name: "FI-ID" (produced by Mitsui Mining & Smelting Co., Ltd.), which has an average particle diameter (median diameter) of 0.3 μm, and a specific surface area of 2.54 $m^2/g$.

The method for determining a shear strength is as follows.

Silver powder, 2 g, obtained by mixing predetermined amounts of silver particles of two types having different average particle diameters, respectively, was mixed with 0.16 g of diethylene glycol monobutyl ether at 25° C., whereby a conductive material composition was obtained. The conductive material composition obtained was applied on a silver-plated surface of an alumina substrate by stamping, and a light-emitting element that has a sapphire substrate having one surface metalized with silver, in a size of 600 μm×600 μm×100 μm (thickness), was mounted on the alumina substrate. This was heated at 200° C. in the air. A shearing power was applied in such a direction that the light-emitting element was separated from the alumina substrate at room temperature, and a strength when the light-emitting element separated therefrom was measured as a shear strength (die-shear strength). The silver particle compositions and the measurement results of the die-shear strengths are shown in Table 1.

TABLE 1

| Ref. Ex. | Silver particle composition (wt %) | | Die-shear strength |
|---|---|---|---|
| | AgC-239 | FHD | (gf) |
| Ref. Ex. 1 | 100 | 0 | 1667 |
| Ref. Ex. 2 | 90 | 10 | 1900 |
| Ref. Ex. 3 | 80 | 20 | 2117 |
| Ref. Ex. 4 | 70 | 30 | 2048 |
| Ref. Ex. 5 | 60 | 40 | 1758 |
| Ref. Ex. 6 | 40 | 60 | 816 |

From these measurement results, it was confirmed that the conductive material obtained from the conductive material composition containing the silver particles having the silver powder composition of Reference Example 3 exhibited the maximum value of the die-shear strength. From observation of surfaces of the conductive materials of Reference Examples 1 to 6, it was confirmed that the silver powder was filled densely in the conductive material of Reference Example 3. In other words, it can be presumed that the shear strength is indicative of a cohesion strength of fused silver powder.

Reference Examples 7 to 9

Relationship Between Thickness of Silver Reflection Film of Light-emitting Element and Delamination Thereof after Fusion of Silver In each of Reference Examples 7 to 9, a light-emitting element including an InGaN blue-light-emitting layer and having a size of 600 μm×600 μm×100 μm (thickness) was used. The light-emitting element had a semiconductor layer on a sapphire substrate, and a back surface of the sapphire substrate was subjected to silver sputtering so that a silver reflection film was formed thereon; the thicknesses of the silver reflection films of Reference Examples 7 to 9 were 250 nm, 360 nm, and 500 nm, respectively. As each package, a package provided integrally with a lead frame made of a white epoxy resin containing titanium oxide was used. The package had a recess, and side faces of the recess functioned as reflectors and were formed of the white epoxy resin, while the lead frame was exposed on a bottom face of the recess. The lead frame was formed of a copper alloy as a base and was plated with silver. Examples, Reference Examples, and Comparative Examples mentioned hereinafter used the same packages as that of Reference Example 7. Silver powder having the silver powder composition of Reference Example 3 that provided the maximum shear strength, 2 g, was mixed with 0.16 g of diethylene glycol monobutyl ether at 25° C., whereby a conductive material composition was obtained. The conductive material composition obtained was applied on a silver-plated surface of a lead frame by stamping, and the light-emitting element was mounted thereon. This was heated at 200° C. in the air. After the package on which the light-emitting element was mounted was returned to room temperature, visual inspection for checking partial delamination (hereinafter referred to as "delamination") of the silver reflection film was conducted using a microscope from the light-emitting element side. Further, electrodes of the light-emitting element and electrodes of the lead frame were connected with each other by gold wiring, and were sealed with a silicone resin, whereby a light-emitting device was obtained. An electric current was passed thorough each light-emitting device in this state, and a light output thereof was measured. The rate of occurrence of delamination of the silver reflection film (delamination occurrence rate of silver reflection film) and light output ratio of each case are shown in Table 2.

TABLE 2

| Ref. Ex. | Thickness of silver reflection film (nm) | Silver particle composition | Delamination occurrence rate of silver reflection film (%) | Light output ratio |
|---|---|---|---|---|
| Ref. Ex. 7 | 250 | Ref. Ex. 3 | 97.5 | 91.6 |
| Ref. Ex. 8 | 360 | Ref. Ex. 3 | 20 | 98.1 |
| Ref. Ex. 9 | 500 | Ref. Ex. 3 | 0 | 100 |

As shown in Table 2, it was confirmed that the delamination at an interface between the silver reflection film and the silver-metalized surface of the sapphire substrate of the light-emitting element immediately after the bonding by the low-temperature fusion of silver particles was dependent on the thickness of the silver reflection film, and as the silver reflection film was thinner, the delamination occurred more. Since it cannot be assumed that there would be any difference in shrinking behaviors upon fusion of the silver-particle low-temperature-fused films, the above-described phenomenon is considered to suggest that a thicker silver reflection film makes plastic deformation easier, thereby preventing the delamination from occurring. Further, there is apprehension that even if the silver reflection film is thickened, the delamination might occur depending on thermal stress exerted in the electronic component producing process and various environmental conditions of the completed light-emitting device, that is, concern about the bonding reliability. Still further, since the light output of a light-emitting device decreases when delamination occurs, the suppression of delamination is necessary, not only for the bonding reliability but also for a higher-power output of a light-emitting device and keeping the same.

Reference Examples 10 to 13

Tendency of Delamination of Silver Reflection Films on Back Surfaces of Transparent Substrates of Various Types after Silver Particle Fusion Silver was sputtered so that a silver reflection film having a thickness of 250 nm was formed onto a back surface of each of substrates of the following four types of light-emitting elements in a size of 600 μm×600 μm×100 μm (thickness): silicon dioxide ($SiO_2$); zinc oxide (ZnO); gallium nitride (GaN); and gallium phosphide (GaP). The silver powder having the silver powder composition of Reference Example 3 that provided the maximum shear strength, 2 g, was mixed with 0.16 g of diethylene glycol monobutyl ether at 25° C., whereby a conductive material composition was obtained. The conductive material composition obtained was applied on silver-plated surfaces of copper-alloy lead frames by stamping, and light-emitting elements of four types were mounted thereon, respectively. These were heated at 200° C. in the air. After the packages on which the light-emitting elements were mounted were returned to room temperature, partial delamination of the silver reflection films was visually confirmed using a microscope from the light-emitting element side. Further, electrodes of the light-emitting element and electrodes of the lead frame were connected with each other by gold wiring, and were sealed with a silicone resin, whereby a light-emitting device was obtained. An electric current was passed thorough each light-emitting device in this state, and a light output thereof was measured. Delamination occurrence rates are shown in Table 3.

TABLE 3

| Ref. Ex. | Transparent substrate | Silver particle composition | Thickness of silver reflection film (nm) | Delamination occurrence rate of silver reflection film (%) |
|---|---|---|---|---|
| Ref. Ex. 7 | Sapphire | Ref. Ex. 3 | 250 | 97.5 |
| Ref. Ex. 11 | $SiO_2$ | Ref. Ex. 3 | 250 | 91.6 |
| Ref. Ex. 12 | GaN | Ref. Ex. 3 | 250 | 81.7 |
| Ref. Ex. 13 | ZnO | Ref. Ex. 3 | 250 | ≈0 |
| Ref. Ex. 14 | GaP | Ref. Ex. 3 | 250 | 0 |

As shown in Table 3, the list of substrates in the descending order of the adhesivities of the silver reflection films thereto is as follows: gallium phosphide; zinc oxide; gallium nitride; silicon dioxide; and sapphire. Thus, it was confirmed that sapphire tended to have the smallest adhesivity with silver, among the transparent substrates used for light-emitting elements. Therefore, the conditions applicable to all of the types of the transparent substrates used for light-emitting elements can be examined by evaluation of delamination of a silver reflection film with respect to sapphire.

Examples 1 to 18

Delamination Suppression Effect Achieved by Addition of Particulate Thermosetting Resin, Electric Resistivity Resulting Therefrom: Examples in which Conductive Material Composition Containing Silver Particles and Full-cured Thermosetting Resin was Used A light-emitting element including an InGaN blue-light-emitting layer and having a size of 600 μm×600 μm×100 μm (thickness) was used. The light-emitting element had a semiconductor layer formed on a sapphire substrate, and a back surface of the sapphire substrate was subjected to silver sputtering so that a silver reflection film having a thickness of 250 nm was formed on the back surface. A conductive material composition containing 2 g of silver powder having the silver powder composition of Reference Example 3 that provided the maximum shear strength, 0.16 g of diethylene glycol monobutyl ether, and a particulate thermosetting resin (added amount: a predetermined percent by weight with respect to the weight of silver particles) was provided on a silver plating of a lead frame by stamping, and the light-emitting element was mounted thereon.

The particulate thermosetting resins used were as follows. It should be noted that each particulate thermosetting resin was formed of a thermosetting resin full-cured by heat.

The following particulate thermosetting resins were used:
Examples 1 to 3: particulate silicone resin (produced by Toray-Dow Corning Co., Ltd., product name: "Dow Corning EP-9215", average particle diameter: 2 to 7 μm, JIS-A hardness: 60, Tg: −120° C.);

Examples 4 to 6: particulate silicone resin having particles coated with titanium oxide (produced by Toray-Dow Corning Co., Ltd., product name: "Dow Corning EP-9261TI", average particle diameter: 2 to 3 μm, JIS-A hardness: 40, Tg: −120° C.);

Examples 7 to 9: particulate silicone resin having particles coated with alumina (produced by Toray-Dow Corning Co., Ltd., product name: "Dow Corning EP-9293AL", average particle diameter: 2 to 3 μm, JIS-A hardness: 40, Tg of silicone resin: −120° C.);

Examples 10 to 13: particulate silicone resin (produced by Momentive Performance Materials Inc., product name: "TOSPEARL 120", average particle diameter: 2 μm, Shore-D hardness: 70 to 80); and Examples 14 to 18: particulate cross-linked polymethyl methacrylate resin (produced by Soken Chemical & Engineering Co., Ltd., product name: "MX-180TA", average particle diameter: 1.9 μm, Tg: 130° C.).

Packages on which the above-described light-emitting elements were mounted were heated at 200° C. in the air. After the packages were returned to room temperature, partial delamination of the silver reflection films was visually confirmed using a microscope from the light-emitting element side. Further, a strength when a shear force was applied in a direction of separating a die from the lead frame and the die was separated was determined as a die-shear strength. Table 4 shows, as to each Example, the added amount of particulate thermosetting resin, the die-shear strength, whether or not the delamination of the silver reflection film occurred, and the electric resistivity determined by a method described later.

about 500 gf is needed in order to provide stable electric connecting by ultrasonic wire bonding.

In view of these, regarding each type of particles, the optimal added amount thereof is an amount such that the delamination can be prevented and a sufficient die-shear strength can be obtained. Particulate silicone resin having a small elasticity exhibited a tendency that the die-shear strength thereof significantly decreases as the added amount of the same increases, but Examples 4 to 6 are useful since the prevention of delamination was enabled with a small amount of the in particulate thermosetting resin. With these results, it can be presumed that the surface state of the resin particles has an influence toward the relaxation of shrinkage stress of the silver-particle-fused film.

Electric resistivity of the conductive materials used in Examples 1 to 18 were determined.

The method for determining the electric resistivity is as shown below.

Mixture silver powder, 2 g, containing silver particles and a particulate thermosetting resin in a predetermined percentage by weight with respect to the weight of silver particles, was mixed with 0.16 g of diethylene glycol monobutyl ether at 25° C., whereby a conductive material composition was obtained. The conductive material composition obtained was applied to a thickness of 200 μm on a glass substrate (thick-

TABLE 4

| Example | Particulate thermosetting resin Modulus of elasticity (MPa) | Added amount (wt %) | Die-shear strength (gf) | Delamination of silver reflection film | Electric resistivity (Ω · cm) |
|---|---|---|---|---|---|
| Ex. 1 | About 2 | 0.5 | 647.7 | Delamination | $5.976 \times 10^{-6}$ |
| Ex. 2 | About 2 | 1 | 425.9 | Delamination | $7.011 \times 10^{-6}$ |
| Ex. 3 | About 2 | 2.3 | 114.7 | Non-delamination | $8.073 \times 10^{-6}$ |
| Ex. 4 | About 2 | 0.5 | 651.5 | Non-delamination | $4.521 \times 10^{-6}$ |
| Ex. 5 | About 2 | 1 | 419.9 | Non-delamination | $6.006 \times 10^{-6}$ |
| Ex. 6 | About 2 | 2.3 | 211.7 | Non-delamination | $6.072 \times 10^{-6}$ |
| Ex. 7 | About 2 | 0.5 | Unmeasured (≈0) | Non-delamination | $5.742 \times 10^{-6}$ |
| Ex. 8 | About 2 | 1 | Unmeasured (≈0) | Non-delamination | $7.048 \times 10^{-6}$ |
| Ex. 9 | About 2 | 2.3 | Unmeasured (≈0) | Non-delamination | $9.504 \times 10^{-6}$ |
| Ex. 10 | About 1500 | 0.5 | 549.3 | Delamination | $4.184 \times 10^{-6}$ |
| Ex. 11 | About 1500 | 1.5 | 512.5 | Delamination | $4.415 \times 10^{-6}$ |
| Ex. 12 | About 1500 | 2.3 | 505.9 | Non-delamination | $5.386 \times 10^{-6}$ |
| Ex. 13 | About 1500 | 3.1 | 432.3 | Non-delamination | $5.966 \times 10^{-6}$ |
| Ex. 14 | About 3000 | 0.3 | 911.3 | Delamination | $4.612 \times 10^{-6}$ |
| Ex. 15 | About 3000 | 0.5 | 731.3 | Non-delamination | $4.637 \times 10^{-6}$ |
| Ex. 16 | About 3000 | 1 | 591.8 | Non-delamination | $6.115 \times 10^{-6}$ |
| Ex. 17 | About 3000 | 2 | 398.9 | Non-delamination | $6.367 \times 10^{-6}$ |
| Ex. 18 | About 3000 | 2.8 | 227.9 | Non-delamination | $6.810 \times 10^{-6}$ |

As shown in Table 4, in Examples 1 to 3, Examples 4 to 6, Examples 7 to 9, Examples 10 to 13, and Examples 14 to 18, it was confirmed that as the added amount of particulate thermosetting resin increased, the occurrence of delamination of the silver reflection film decreased. In order to prevent the delamination, the addition of at least 0.5 wt % of the particulate thermosetting resin was needed.

As shown in Table 4, in Examples 1 to 3, Examples 4 to 6, Examples 10 to 13, and Examples 14 to 18, as the added amount of the thermosetting resin was smaller, a higher die-shear strength was exhibited. Regarding Examples 7 to 9, it is presumed that the same tendency will be exhibited when the added amount is further smaller than the range in the present examination. It is considered that a die-shear strength of ness: 1 mm) by screen-printing. The glass substrate on which the conductive material composition was applied was heated in the air at 200° C. An electric resistivity of the obtained wiring (conductive material) was determined by the four-electrode method using "MCP-T600" (product name, produced by Mitsubishi Chemical Corporation).

As shown in Table 4, the electric resistivity in Examples 1 to 18 had a tendency of increasing with an increase in the added amount of the particulate thermosetting resin, but it was confirmed that the electric resistivity corresponding to the die-shear strengths in a range suitable for the practical application remained in $10^{-6}$ order. It should be noted that the electric resistivity in Reference Example 3 was $4.512 \times 10^{-6}$ Ω·cm. In view of that an electric resistivity of a conductive material obtained from a conventional conductive adhesive obtained by dispersing a flake-form silver filler in an epoxy resin or the like exceeds $5 \times 10^{-5}$ Ω·cm, obviously the conductive material obtained by the producing method of the present invention has superiority.

FIG. 19 is a photograph showing a bonding state of a conductive material of Example 18. As shown in this photograph, particles 105 of the particulate thermosetting resin sufficiently cross-linked were not molten, but maintained their initial particular form in the fused silver particles 106 until the temperature reached the thermal decomposition temperature.

Examples 19 to 42

Delamination Suppression Effect Achieved by Addition of Particulate Thermoplastic Resin, Electric Resistivity Resulting Therefrom: Examples in which Conductive Material Composition Containing Silver Particles and Thermoplastic Resin was Used A light-emitting element including an InGaN blue-light-emitting layer and having a size of 600 μm×600 μm×100 μm (thickness) was used. The light-emitting element had a semiconductor layer on a sapphire substrate, and a back surface of the sapphire substrate was subjected to silver sputtering so that a silver reflection film having a thickness of 250 nm was formed on the back surface. A conductive material composition containing 2 g of silver powder having the silver powder composition of Reference Example 3 that provided the maximum shear strength, 0.16 g of diethylene glycol monobutyl ether, and a particulate thermoplastic resin (added amount: a predetermined percent by weight with respect to the weight of silver particles) was provided on a silver plating of a lead frame by stamping, and the light-emitting element was mounted thereon.

The method for preparing the used particulate thermoplastic resin is as follows. The particulate thermoplastic resin used in Examples 19 to 28 was a particulate cross-linked polystyrene resin (produced by Soken Chemical & Engineering Co., Ltd., product name: "KSR-3", average particle diameter: 3.3 μm, glass transition temperature: 108° C.). In Examples 29 to 34, particulate polystyrene produced by the following method was used. 100 g of polystyrene monomer purified by distillation, 3 g of sodium dodecyl sulfate, and 120 g of pure water were charged in a three-neck flask equipped with a reflux condenser tube, a thermometer, and an impeller motor, and were stirred at 70° C. After nitrogen was introduced into the flask, 0.2 g of ammonium persulfate was dissolved in pure water, and this was charged into the flask. After the contents were allowed to react under stirring for three hours, an aggregate in the flask was separated by filtration with a 100-mesh filter. The polymer-dispersed liquid obtained by the filtration was put into a large amount of ethanol, so that polystyrene particles precipitated. The polystyrene particles were separated by suction filtration, rinsed with ethanol, and dried at room temperature under a reduced pressure. The polystyrene particles obtained had an average particle diameter of 13 μm, and a glass transition temperature of 103° C. (DSC method).

In Examples 35 to 42, a particulate polymethyl methacrylate produced by the following method was used. 100 g of methyl methacrylate monomer purified by distillation, 3 g of sodium dodecyl sulfate, and 120 g of pure water were charged in a three-neck flask equipped with a reflux condensing tube, a thermometer, and an impeller-provided motor, and were stirred at 70° C. After nitrogen was introduced into the flask, 0.2 g of ammonium persulfate was dissolved in pure water, and this was charged into the flask. After the contents were allowed to react under stirring for three hours, an aggregate in the flask was separated by filtration with a 100-mesh filter. The polymer-dispersed liquid obtained by the filtration was put into a large amount of ethanol, so that polymethyl methacrylate particles precipitated. The polymethyl methacrylate particles were separated by suction filtration, rinsed with ethanol, and dried at room temperature under a reduced pressure. The polymethyl methacrylate particles obtained had an average particle diameter of 8.0 μm, and a glass transition temperature of 127° C. (DSC method).

A package on which the light-emitting element was mounted was heated in the air of 200° C. After this was returned to room temperature, partial delamination of the silver reflection film was visually confirmed using a microscope from the light-emitting element side. Further, a strength when a shear force was applied in a direction of separating a die from the lead frame and the die was separated was determined as a die-shear strength. Table 5 shows, as to each Example, the added amount of particulate thermoplastic resin, the die-shear strength, whether or not the delamination of the silver reflection film occurred, and the electric resistivity determined by a method described later.

TABLE 5

| Example | Added amount of resin (wt %) | Die-shear strength (gf) | Delamination of silver reflection film | Electric resistivity (Ω·cm) |
|---|---|---|---|---|
| Ex. 19 | 0.3 | 760.3 | Delamination | $4.855 \times 10^{-6}$ |
| Ex. 20 | 0.5 | 640.1 | Non-delamination | $4.680 \times 10^{-6}$ |
| Ex. 21 | 1 | 603.4 | Non-delamination | $4.990 \times 10^{-6}$ |
| Ex. 22 | 2 | 578.2 | Non-delamination | $5.227 \times 10^{-6}$ |
| Ex. 23 | 2.5 | 686.8 | Non-delamination | $6.880 \times 10^{-6}$ |
| Ex. 24 | 3.3 | 637 | Non-delamination | $6.468 \times 10^{-6}$ |
| Ex. 25 | 4.2 | 708 | Non-delamination | $7.925 \times 10^{-6}$ |
| Ex. 26 | 5.2 | 671.8 | Non-delamination | $8.845 \times 10^{-6}$ |
| Ex. 27 | 6.4 | 365.5 | Non-delamination | $9.711 \times 10^{-6}$ |
| Ex. 28 | 7.7 | 226.1 | Non-delamination | $1.070 \times 10^{-5}$ |
| Ex. 29 | 0.3 | 826 | Delamination | $4.435 \times 10^{-6}$ |
| Ex. 30 | 0.4 | 787.6 | Delamination | $4.712 \times 10^{-6}$ |
| Ex. 31 | 0.5 | 780 | Non-delamination | $5.061 \times 10^{-6}$ |
| Ex. 32 | 1.1 | 679.7 | Non-delamination | $6.005 \times 10^{-6}$ |
| Ex. 33 | 1.8 | 212 | Non-delamination | $7.560 \times 10^{-6}$ |
| Ex. 34 | 2.5 | 169.9 | Non-delamination | $1.244 \times 10^{-6}$ |
| Ex. 35 | 0.4 | 911.2 | Delamination | $4.621 \times 10^{-6}$ |
| Ex. 36 | 0.5 | 898 | Non-delamination | $4.847 \times 10^{-6}$ |
| Ex. 37 | 0.7 | 834.5 | Non-delamination | $5.040 \times 10^{-6}$ |
| Ex. 38 | 1.3 | 796.4 | Non-delamination | $5.472 \times 10^{-6}$ |
| Ex. 39 | 2 | 746.8 | Non-delamination | $6.468 \times 10^{-6}$ |
| Ex. 40 | 3 | 538.3 | Non-delamination | $8.240 \times 10^{-6}$ |
| Ex. 41 | 4 | 447.2 | Non-delamination | $1.267 \times 10^{-5}$ |
| Ex. 42 | 5 | 427.6 | Non-delamination | $1.574 \times 10^{-5}$ |

As shown in Table 5, in Examples 19 to 28, the relationship between the added amount of the particulate thermoplastic resin and the die-shear strength exhibited a specific tendency. Therefore, the state of the thermoplastic resin present in the conductive material was checked by observation, and it was found that no initial particulate form of the thermoplastic resin was recognized in the silver-particle-fused film, as seen in the photograph of FIG. 20. In other words, this is assumed to indicate a behavior of getting welded at a certain specific temperature, which is a behavior of the thermoplastic resin. Therefore, if a thermoplastic resin that can be welded under the conditions for the fusion of silver particles is used, it is possible to prevent the delamination of the silver reflection film while a wide range is ensured for the added amount of the thermoplastic resin, without a significant decrease in the die-shear strength. The melting temperature can be presumed easily from the known melting point and glass transition temperature. Since an electronic component is generally required to have reliability and stability up to about 100° C., it is difficult to use a thermoplastic resin that is molten and solidified repeatedly or has a mechanical property changing point at which mechanical properties change significantly at a temperature of 90° C. or lower. Further, a thermoplastic resin that is molten at a low temperature has a risk of inhibiting the phenomenon of fusion of silver particles itself. Therefore, it is necessary to examine the validity of the lower limit of temperature, using particulate thermoplastic resins having a mechanical property changing point in the vicinity of 100° C.

As shown in Examples 19 to 42 in Table 5, the suppression of delamination of the silver reflection film is enabled by addition of 0.5 wt % or more of the thermoplastic resin. In the case where more than 0 wt % and less than 1.8 wt % of a thermoplastic resin is added, as is the case with Examples 29 to 32 shown in Table 5, a further higher die-shear strength can be maintained. Besides, in Examples 31 and 32, the delamination of the silver reflection film did not occur. On the other hand, in the case where 1.1 wt % or less of a thermoplastic resin is added, as is the case with Examples 29 to 32, the fusion phenomenon of silver particles is promoted, and the die-shear strength can be maintained. The reason for this is presumed as follows: since the melting temperature of the thermoplastic resin is low, the control of the amount of the thermoplastic resin allows the thermoplastic resin to be molten after the silver particles start fusing, and as a result, prevent silver particle surfaces from being coated with the thermoplastic resin.

As shown in Examples 35 to 42 in Table 5, in the case where more than 0 wt % and not more than 5.0 wt % of the thermoplastic resin is added, it is possible to maintain a high die-shear strength. Further, as shown in Examples 36 to 42 in Table 5, if 0.5 wt % or more of the thermoplastic resin is added, the delamination of the silver reflection film can be eliminated. This is owing to influences from the glass transition temperature of 116° C. of polymethyl methacrylate of Examples 35 to 42, which is higher than that of polystyrene of Examples 29 to 34, whereby the melting temperature of polymethyl methacrylate is high. Therefore, the added amount of polymethyl methacrylate can be increased. This result proves that in the case of an amorphous polymer, a wider range of an added amount is ensured for an amorphous polymer having a higher glass transition temperature as an index for the melting temperature. Besides, it is presumed that polystyrene having a glass transition temperature of 100° C. is a limit practically, and in view of this, it is necessary that in the case of a particulate amorphous polymer, the polymer should have a glass transition temperature of 100° C. or higher.

The particulate cross-linked polystyrene in Examples 19 to 28 has a glass transition temperature of 113° C. (DSC method), and an added amount of the same can be increased even though the glass transition temperature thereof is lower than that of polymethyl methacrylate of Examples 35 to 42. The reason for this is presumed as follows: ΔT of a melting temperature from the glass transition temperature can be set greater by partially introducing a cross-linked structure, which results in that the melting temperature becomes substantially higher than that of polymethyl methacrylate. Further, it is well known that in the case of a crystalline polymer, the glass transition temperature of the polymer is not an index for a melting temperature and a mechanical property changing point, but these are dependent on the melting point of the polymer. Therefore, in the case of the crystalline polymer, it is necessary that the melting point thereof has to be 100° C. or higher. A semi-cured thermosetting resin also is molten by heating. Since a thermosetting resin after being molten and until being full-cured can be regarded as a thermoplastic resin, the freezing point thereof as an index for a melting start temperature has to be 100° C. or higher, for the same reason.

Electric resistivity of the conductive materials used in Examples 19 to 42 were determined.

The method for determining the electric resistivity is as shown below.

Mixture silver powder, 2 g, containing silver particles and a particulate thermoplastic resin in a predetermined percentage by weight with respect to the weight of silver particles, was mixed with 0.16 g of diethylene glycol monobutyl ether at 25° C., whereby a conductive material composition was obtained. The conductive material composition obtained was applied to a thickness of 200 μm on a glass substrate (thickness: 1 mm) by screen-printing. The glass substrate on which the conductive material composition was applied was heated in the air at 200° C. An electric resistivity of the obtained wiring (conductive material) was determined by the four-electrode method using "MCP-T600" (product name, produced by Mitsubishi Chemical Corporation).

As shown in Table 5, the electric resistivity in Examples 19 to 42 had a tendency of increasing with an increase in the added amount of the particulate thermoplastic resin, but it was confirmed that the electric resistivity corresponding to the die-shear strengths in a range suitable for the practical application remained in $10^{-6}$ order. In view of that an electric resistivity of a conventional conductive adhesive a common conductive adhesive obtained by dispersing a flake-form silver filler in an epoxy resin or the like exceeds $5\times10^{-5}$ Ω·m, obviously the conductive material obtained by the producing method of the present invention has superiority.

It should be noted that, as shown in the photograph of FIG. 20, the particulate thermoplastic resin is welded and is located in voids between fused silver particles. This is obvious from that the particulate thermoplastic resin 107 lost the initial form thereof completely, and the initial form was not recognized at all.

Examples 43 to 48

Delamination Suppression Effect Achieved by Addition of Particulate Partially-cross-linked Thermoplastic Resin, Electric Resistivity Resulting Therefrom: Examples in which Conductive Material Composition Containing Silver Particles and Partially-Cross-Linked Thermoplastic Resin was Used A light-emitting element including an InGaN blue-light-emitting layer and having a size of 600 μm ×600 μm×100 μm (thickness) was used. The light-emitting element had a semiconductor layer on a sapphire substrate, and a back surface of the sapphire substrate was subjected to silver sputtering so that a silver reflection film having a thickness of 250 nm was formed on the back surface. A conductive material composition containing 2 g of silver powder having the silver powder composition of Reference Example 3 that provided the maximum shear strength, 0.16 g of diethylene glycol monobutyl ether, and a particulate thermoplastic resin that was prepared so as to have a cross-linked structure partially (added amount: a predetermined percent by weight with respect to the weight of silver particles) was provided on a silver plating of a lead frame by stamping, and the light-emitting element was mounted thereon.

The method for preparing the used particulate thermoplastic resin is as follows.

In Examples 43 to 48, a particulate partially-cross-linked polymethyl methacrylate resin produced by the following method was used.

95 g of methyl methacrylate monomer purified by distillation, 5 g of divinylbenzene purified by distillation, 3 g of sodium dodecyl sulfate, and 120 g of pure water were charged in a three-neck flask equipped with a reflux condenser tube, a thermometer, and an impeller motor, and were stirred at 70° C. After nitrogen was introduced into the flask, 0.2 g of ammonium persulfate was dissolved in pure water, and this was charged into the flask. After the contents were allowed to react under stirring for three hours, an aggregate in the flask was separated by filtration with a 100-mesh filter. The polymer dispersed liquid obtained by the filtration was put into a large amount of ethanol, so that partially-cross-linked polymethyl methacrylate particles precipitated. The partially-cross-linked polymethyl methacrylate particles were separated by suction filtration, rinsed with ethanol, and dried at room temperature under a reduced pressure. The partially-cross-linked polymethyl methacrylate particles obtained had an average particle diameter of 8 μm, and a glass transition temperature of 130° C. (DSC method).

A package on which the light-emitting element was mounted was heated in the air of 200° C. After this was returned to room temperature, partial delamination of the silver reflection film was visually confirmed using a microscope from the light-emitting element side. Further, a strength when a shear force was applied in a direction of separating a die from the lead frame and the die was separated was determined as a die-shear strength. Table 6 shows, as to each Example, the added amount of particulate thermoplastic resin, the die-shear strength, whether or not the delamination of the silver reflection film occurred, and the electric resistivity determined by a method described later.

TABLE 6

| Example | Added amount of resin (wt %) | Die-shear strength (gf) | Delamination of silver reflection film | Electric resistivity (Ω · cm) |
|---|---|---|---|---|
| Ex. 43 | 0.5 | 906.4 | Non-delamination | $5.059 \times 10^{-6}$ |
| Ex. 44 | 3 | 630.2 | Non-delamination | $6.065 \times 10^{-6}$ |
| Ex. 45 | 4 | 607.4 | Non-delamination | $6.846 \times 10^{-6}$ |
| Ex. 46 | 5 | 590.4 | Non-delamination | $7.668 \times 10^{-6}$ |
| Ex. 47 | 6 | 550.3 | Non-delamination | $8.235 \times 10^{-6}$ |
| Ex. 48 | 7 | 442.1 | Non-delamination | $1.112 \times 10^{-5}$ |

As shown in Table 6, it was confirmed that as is the case with Examples 43 to 48, by partially cross-linking polymethyl methacrylate, it is possible to significantly increase the added amount of the resin, while maintaining a practical die-shear strength of the obtained conductive material. The reason for this is presumed to be that the cross-linking causes an increase in the melting temperature of the resin. Therefore, even in the case of an amorphous polymer having a glass transition temperature of about 100° C., the introduction of the partially-cross-linked structure into the polymer makes it possible to ensure a wider range for the added amount of the polymer, without inhibiting the fusion phenomenon of silver particles.

Electric resistivity of the conductive materials used in Examples 43 to 48 were determined.

The method for determining the electric resistivity is as shown below.

Mixture silver powder, 2 g, containing silver particles and a partially-cross-linked polymethyl methacrylate in a predetermined percentage by weight with respect to the weight of silver particles, was mixed with 0.16 g of diethylene glycol monobutyl ether at 25° C., whereby a conductive material composition was obtained. The conductive material composition obtained was applied to a thickness of 200 μm on a glass substrate (thickness: 1 mm) by screen-printing. The glass substrate on which the conductive material composition was applied was heated in the air at 200° C. An electric resistivity of the obtained wiring (conductive material) was determined by the four-electrode method using "MCP-T600" (product name, produced by Mitsubishi Chemical Corporation).

As shown in Table 6, the electric resistivity in Examples 43 to 48 had a tendency of increasing with an increase in the added amount of the particulate partially-cross-linked thermoplastic resin, but it was confirmed that the electric resistivity corresponding to the die-shear strengths in a range suitable for the practical application remained in $10^{-6}$ order. In view of that an electric resistivity of a conventional conductive adhesive obtained by dispersing a flake-form silver filler in an epoxy resin or the like exceeds $5 \times 10^{-5}$ Ω·m, obviously the conductive material obtained by the producing method of the present invention has superiority.

Examples 49 to 54

Delamination Suppression Effect Achieved by Addition of Particulate Thermosetting Resin and Particulate Thermoplastic Resin at a Time, Electric Resistivity Resulting Therefrom: examples in which Conductive Material Composition Containing Silver Particles, Full-cured Thermosetting Resin, and Thermoplastic Resin was Used A light-emitting element including an InGaN blue-light-emitting layer and having a size of 600 μm×600 μm×100 μm (thickness) was used. The light-emitting element had a semiconductor layer on a sapphire substrate, and a back surface of the sapphire substrate was subjected to silver sputtering so that a silver reflection film having a thickness of 250 nm was formed on the back surface. A conductive material composition containing 2 g of silver powder having the silver powder composition of Reference Example 3 that provided the maximum shear strength, 0.16 g of diethylene glycol monobutyl ether, a particulate thermosetting resin and a particulate thermoplastic resin (added amounts: predetermined percents by weight with respect to the weight of silver particles) was provided on a silver plating of a lead frame by stamping, and the light-emitting element was mounted thereon. For each of Examples 49 to 54, a surface-mount-type package (produced by Nichia Corporation, product name: "NS3W183") was used.

The particulate thermosetting resin and the particulate thermoplastic resin that were used are as follows. The particulate thermosetting resin used in Examples 49 to 51 was a particulate cross-linked polymethyl methacrylate resin (produced by Soken Chemical & Engineering Co., Ltd., product name: "MX-180TA", average particle diameter: 1.9 μm, Tg: 130° C.), and the thermoplastic resin used therein was a particulate cross-linked polystyrene resin (produced by Soken Chemical & Engineering Co., Ltd., product name: "KSR-3", average particle diameter: 3.3 μm, Tg: 108° C.).

The particulate thermosetting resin used in Examples 52 to 54 was a particulate cross-linked polymethyl methacrylate resin (produced by Soken Chemical & Engineering Co., Ltd., product name: "MX-180TA", average particle diameter: 1.9 μm, Tg: 130° C.), and the thermoplastic resin used therein was a particulate partially-cross-linked polymethyl methacrylate having an average particle diameter of 8 μm, and Tg of 113° C. (DSC method).

Packages on which light-emitting elements were mounted were heated in the air at 200° C. After each of these was returned to room temperature, partial delamination of the silver reflection film was visually confirmed using a microscope from the light-emitting element side. Further, a strength when a shear force was applied in a direction of separating a die from the lead frame and the die was separated was determined as a die-shear strength. Table 7 shows, as to each Example, the added amount of particulate thermosetting resin, the added amount of particulate thermoplastic resin, the die-shear strength, whether or not the delamination of the silver reflection film occurred, and the electric resistivity determined by a method described later.

TABLE 7

| Example | Added amount of thermosetting resin (wt %) | Added amount of thermoplastic resin (wt %) | Die-shear strength (gf) | Delamination of silver reflection film | Electric resistivity (Ω · cm) |
| --- | --- | --- | --- | --- | --- |
| Ex. 49 | 0.5 | 0.5 | 976.8 | Non-delamination | $5.149 \times 10^{-6}$ |
| Ex. 50 | 0.5 | 1.5 | 970.4 | Non-delamination | $5.450 \times 10^{-6}$ |
| Ex. 51 | 0.5 | 2.5 | 733.3 | Non-delamination | $5.951 \times 10^{-6}$ |
| Ex. 52 | 0.5 | 0.5 | 804 | Non-delamination | $4.945 \times 10^{-6}$ |
| Ex. 53 | 0.5 | 1.5 | 659.8 | Non-delamination | $5.958 \times 10^{-6}$ |
| Ex. 54 | 0.5 | 2.5 | 642.5 | Non-delamination | $6.523 \times 10^{-6}$ |

It was confirmed from Examples 49 and 52 shown in Table 7 that the suppression of delamination of the silver reflection film was enabled by adding 0.5 wt % each of the particulate thermosetting resin and the particulate thermoplastic resin. In view of the tendency of the die-shear strength in Examples 49 to 54 shown in Table 7, the die-shear strength did not exhibit any tendency of being significantly decreased by the coexistence of the particulate thermosetting resin and the particulate thermoplastic resin, and it is presumed that the die-shear strength is dependent on the properties of the particulate resin in the larger amount.

Electric resistivity of the conductive materials used in Examples 19 to 42 were determined.

The method for determining the electric resistivity is as shown below.

Mixture silver powder, 2 g, containing silver particles, as well as a particulate thermosetting resin and a particulate thermoplastic resin in respective predetermined percentages by weight with respect to the weight of silver particles, was mixed with 0.16 g of diethylene glycol monobutyl ether at 25° C., whereby a conductive material composition was obtained. The conductive material composition obtained was applied to a thickness of 200 µm on a glass substrate (thickness: 1 mm) by screen-printing. The glass substrate on which the conductive material composition was applied was heated in the air at 200° C. An electric resistivity of the obtained wiring (conductive material) was determined by the four-electrode method using "MCP-T600" (product name, produced by Mitsubishi Chemical Corporation).

As shown in Table 7, the electric resistivity in Examples 49 to 54 had a tendency of increasing with an increase in the added amount of the particulate resin, but it was confirmed that the electric resistivity corresponding to the die-shear strengths in a range suitable for the practical application remained in $10^{-6}$ order. In view of that an electric resistivity of a common conductive adhesive obtained by dispersing a flake-foam silver filler in an epoxy resin or the like exceeds $5 \times 10^{-5}$ Ω·cm, obviously the conductive material obtained by the producing method of the present invention has superiority.

Examples 55 and 56, Comparative Examples 1 and 2

Light-emitting Device

In Example 55, in a package on which a light-emitting element produced under the same conditions as those in Example 15 was mounted, electrodes of the light-emitting element and electrodes of the lead frame were connected by gold wiring, and were sealed with a silicone resin, whereby a light-emitting device was formed.

In Example 56, in a package on which a light-emitting element produced under the same conditions as those in Example 31 was mounted, electrodes of the light-emitting element and electrodes of the lead frame were connected by gold wiring, and were sealed with a silicone resin, whereby a light-emitting device was formed.

In Comparative Example 1, a light-emitting device was formed so as to have the same configuration as that of Example 55 except that an insulating transparent epoxy resin was used as the conductive material used for mounting the light-emitting element.

In Comparative Example 2, a light-emitting device was formed so as to have the same configuration as that of Example 55 except that a silver paste containing 80 wt % of a flake-form silver filler and 20 wt % of an epoxy resin was used as the conductive material used for mounting the light-emitting element.

The light-emitting devices according to Examples 55, 56, and Comparative Examples 1, 2 as-is were subjected to operating tests and thermal shock tests from −40° C. to 100° C., and how the light output attenuated after 1000 hours of operation and whether or not the silver reflection film was delaminated after 1000 cycles of thermal shock were checked. The results are shown in Table 8.

TABLE 8

| Example/ Comparative Example | Light output maintenance rate after 1000 hours operation (%) | Delamination occurrence rate of of silver reflection film after 1000 cycels of thermal shock (%) | Discoloration |
| --- | --- | --- | --- |
| Ex. 55 | 98 | 0 | Not discolored |
| Ex. 56 | 98 | 0 | Not discolored |
| Comp. Ex. 1 | 83 | 0 | Discolored |
| Comp. Ex. 2 | 79 | 0 | Discolored |

As shown in Table 8, it was confirmed that the light-emitting devices according to Examples 55 and 56 maintained high outputs even after 1000 hours passed. On the other hand, it was also confirmed that the outputs of the light-emitting devices obtained in Comparative Examples 1 and 2 significantly decreased after 1000 hours passed.

Further, as shown in Table 8, it was confirmed that after 1000 hours passed, the conductive materials of Examples 55 and 56, each of which was provided between the light-emitting element and the lead frame, did not exhibit discoloration. In contrast, as shown in Table 8, it was confirmed that after 1000 hours passed, in a fillet part of a mounting member of the insulating transparent epoxy resin of Comparative Example 1, provided between the light-emitting element and the lead frame, the insulating transparent epoxy resin slightly turned yellowish. Further, as shown in Table 8, it was confirmed that after 1000 hours passed, a fillet part of a mounting member of the silver paste containing 80 wt % of flake-form silver filler and 20 wt % of epoxy resin of Comparative Example 2, provided between the light-emitting element and the lead frame, slightly turned blackish-brownish.

As shown in Table 8, it was confirmed that the silver reflection films on back surfaces of the light-emitting elements in the light-emitting devices obtained in Examples 55 and 56 were not delaminated even after 1000 cycles of thermal shock.

Example 57

Lighting Device

Figure 21:
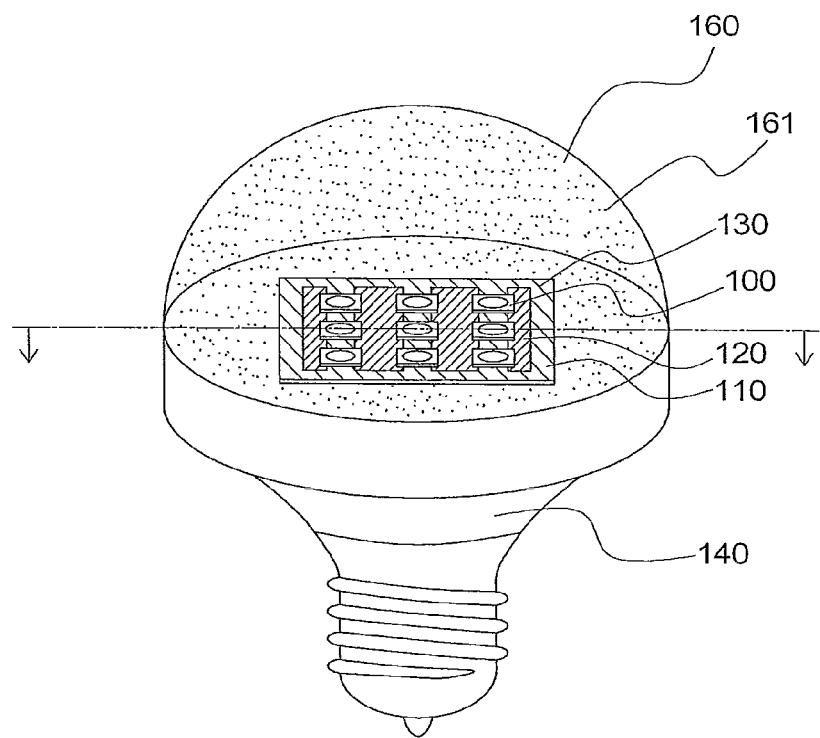
FIG. 21 is a schematic perspective view illustrating a lightning device.
Figure 22:
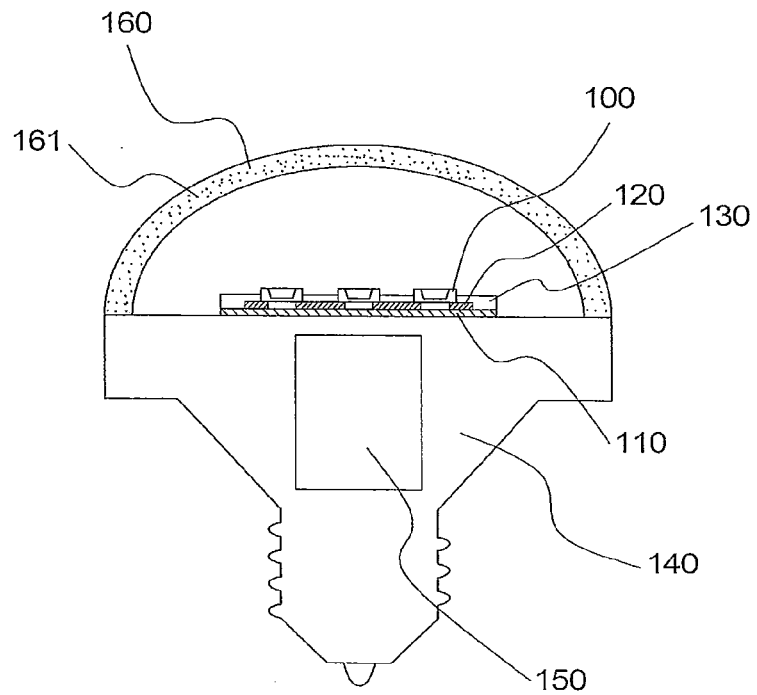
FIG. 22 is a schematic cross-sectional view illustrating the lightning device.

A lighting device according to Example 57 is described below, with reference to the drawings. FIG. 21 is a schematic perspective view illustrating a lighting device. FIG. 22 is a schematic cross-sectional view illustrating the lighting device.

The conductive material composition used in Example 47 was printed directly onto a resist ink surface of an aluminum substrate 110 on which an insulating high-reflection white resist ink was applied, using a metal mask, so that a circuit pattern was formed thereon. This was heated in the air at 200° C., whereby a circuit pattern 120 of a silver-fused film was obtained. A light-emitting device 100 obtained in Example 50 was mounted thereon by soldering. A translucent silicone varnish containing principally phenyl silicone was coated to a thickness of 300 µm over an entire one-side surface of the aluminum substrate including the circuit pattern of the silver-fused film for the protection of the surface, whereby a protection film 130 was formed. Subsequently, this was electrically connected with a case 140 having a power source circuit 150, and a dome-like translucent diffusion lens 160 containing a light-diffusing material 161 was disposed immediately above a light-emitting part, whereby a lighting device was obtained.

The adhesivity of the circuit pattern formed of the insulating high-reflection white resist ink and the silver-fused film of the lighting device obtained in Example 57 was strong enough for practical application, since no delamination occurred through the entire process of producing the lighting device. Further, an upper surface of the silver-fused film had a sufficient solder wettability, and it was confirmed that the partially-cross-linked polymethyl methacrylate in the silver-fused film did not seep out onto the upper surface of the fused film upon melting (no bleedout).

Adhesivity Between Insulating High-Reflection Resist Ink and Silver-Fused Film

Examples 58 to 64

A light-emitting element including an InGaN blue-light-emitting layer and having a size of 600 µm×600 µm×100 µm (thickness) was used. The light-emitting element had a semiconductor layer formed on a sapphire substrate, and a back surface of the sapphire substrate was subjected to silver sputtering so that a silver reflection film having a thickness of 250 nm was formed on the back surface. A conductive material composition was prepared by adding the particulate partially-cross-linked polymethyl methacrylate resin used in Examples 43 to 48, in an amount of a predetermined percent by weight with respect to the weight of the silver particles, to the silver particles having the silver powder composition of Reference Example 3 that provided the maximum shear strength. On an aluminum substrate having one surface coated with the insulating high-reflection white resist ink used in Example 57, the obtained conductive material composition was applied by stamping onto the resist ink surface, and the light-emitting element was mounted thereon.

Each aluminum substrates on which the light-emitting element was mounted was heated in the air at 200° C. After these were returned to room temperature, a strength when a shear force was applied in a direction of separating a die from the aluminum substrate and the die was separated was determined as a die-shear strength.

TABLE 9

| Example | Added amount of resin (wt %) | Die-shear strength (gf) |
|---|---|---|
| Ex. 58 | 0 | 12.1 |
| Ex. 59 | 1 | 200.5 |
| Ex. 60 | 2 | 252.1 |
| Ex. 61 | 3 | 311.4 |
| Ex. 62 | 4 | 432.3 |
| Ex. 63 | 5 | 450.2 |
| Ex. 64 | 6 | 465.3 |

As indicated by the results of Example 58 in Table 9, it was confirmed that the silver particles per se did not exhibit bonding properties with respect to the insulating high-reflection resist ink as a plastic material. As indicated by the results of Examples 59 to 64 in Table 9, as the amount of the particulate partially-cross-linked polymethyl methacrylate resin added to the silver particles increased, the die-shear strength of the obtained conductive material increased on a proportional basis. The following can be presumed: the particulate partially-cross-linked polymethyl methacrylate resin was molten and liquefied upon heating at 200° C., seeped out, via the silver-fused film having a porous structure, onto an interface with the insulating high-reflection white resist ink, and functioned as an adhesive. In other words, it is considered that in a part where an article was present, the molten and liquefied resin component spread over a surface of the article due to the surface tension of the article, thereby seeping onto the interface.

Industrial Applicability

The method for producing a conductive material according to present invention can be used for the purpose of producing, for example, heat-resistant power wiring, component electrodes, die attaches, microbumps, flat panels, solar wiring, and the like, the purpose of wafer bonding, and the purpose of producing electronic components produced using these in combination. The method for producing a conductive material according to the present invention also can be used for, for example, producing a light-emitting device in which a light-emitting element such as a light-emitting diode or a laser diode is used.

DESCRIPTION OF REFERENCE NUMERALS 10 light-emitting element
11 protection element
20 package
21 lead
30 sealing resin
40 conductive material
50 wire 60 fluorescent substance
71 sapphire substrate
72 silver
73 conductive material
74 silver plating
75 lead frame
80, 90 substrate
81, 91 semiconductor
82 n-side electrode
83, 93 p-side electrode
84, 94 silver
85, 95 buffer member
86, 96 silver
87, 97 lead frame
88, 98 silver plating
89, 99 conductive material
100 light-emitting device
110 aluminum substrate
120 circuit pattern
130 protection film
140 case
150 power source circuit
160 lens
161 light-diffusing material

The invention claimed is:

1. method for producing a conductive material, comprising the step of heating a conductive material composition, the conductive material composition consisting essentially of:
at least one of a full-cured or semi-cured thermosetting resin in a particulate form and a thermoplastic resin in a particulate form;
particles made of silver;
a metal oxide which is one or more selected from the group consisting of AgO, $Ag_2O$, and $Ag_2O_3$; and
an organic solvent having a boiling point of 300° C. or lower, or water.

2. The method for producing a conductive material according to claim 1, wherein the thermosetting resin or the thermoplastic resin is in a particulate form having an average particle diameter of 0.1 μm to 10 μm both inclusive.

3. The method for producing a conductive material according to claim 1, wherein an added amount of the full-cured thermosetting resin is more than 0 wt % and not more than 5 wt % with respect to a weight of the silver particles.

4. The method for producing a conductive material according to claim 1, wherein an added amount of the semi-cured thermosetting resin is more than 0 wt % and not more than 10 wt % with respect to a weight of the silver particles.

5. The method for producing a conductive material according to claim 1, wherein an added amount of the thermoplastic resin is more than 0 wt % and not more than 10 wt % with respect to a weight of the silver particles.

6. The method for producing a conductive material according to claim 1, wherein the full-cured thermosetting resin has a glass transition temperature (Tg) of either –40° C. or lower, or 100° C. or higher.

7. The method for producing a conductive material according to claim 1, wherein the semi-cured thermosetting resin has a glass transition temperature (Tg) of 100° C. or higher.

8. The method for producing a conductive material according to claim 1, wherein the thermoplastic resin has a glass transition temperature (Tg) or a melting point of 100° C. or higher.

9. The method for producing a conductive material according to claim 1, wherein the organic solvent contains at least any of a lower alcohol, and a lower alcohol having one or more substituents selected from the group consisting of: methoxy, ethoxy, n-propoxy, i-propoxy, n-butoxy, i-butoxy, sec-butoxy, t-butoxy, or n-pentyloxy; methoxy, ethoxy, n-propoxy, i-propoxy, n-butoxy, i-butoxy, sec-butoxy, t-butoxy, or n-pentyloxy substituted with methoxy, ethoxy, n-propoxy, i-propoxy, n-butoxy, i-butoxy, sec-butoxy, t-butoxy, or n-pentyloxy; amino; and halogen.

10. The method for producing a conductive material according to claim 1, wherein a temperature for heating in the heating step is in a range of 150° C. to 400° C.

11. The method for producing a conductive material according to claim 1, wherein, in the case where the silver particles are of one type having one average particle diameter (median diameter), the average particle diameter (median diameter) is 0.1 μm to 15 μm.

12. The method for producing a conductive material according to claim 1, wherein, in the case where the silver particles are a mixture of two types having respective average particle diameters (median diameters) in combination, the combination is one type having an average particle diameter (median diameter) in a range of 0.1 μm to 15 μm and the other type having an average particle diameter (median diameter) in a range of 0.1 μm to 15 μm.

13. A method for producing a conductive material, comprising the step of heating a conductive material composition, which does not include a metal oxide, in an atmosphere of oxygen, ozone, or air, the conductive material composition consisting essentially of:
at least one of a full-cured or semi-cured thermosetting resin in a particulate form and a thermoplastic resin in a particulate form;
particles made of silver; and
an organic solvent having a boiling point of 300° C. or lower, or water,
wherein, in the case where the particles made of silver are of one type having one average particle diameter (median diameter), the average particle diameter median diameter is 0.1 μm to 15μm.

14. The method for producing a conductive material according to claim 13, wherein the thermosetting resin or the thermoplastic resin is in a particulate form having an average particle diameter of 0.1 μm to 10 μm both inclusive.

15. The method for producing a conductive material according to claim 13, wherein an added amount of the thermoplastic resin is more than 0 wt % and not more than 10 wt % with respect to a weight of the silver particles.

16. The method for producing a conductive material according to claim 13, wherein the thermoplastic resin has a glass transition temperature (Tg) or a melting point of 100° C. or higher.

17. The method for producing a conductive material according to claim 13, wherein the organic solvent contains at least any of a lower alcohol, and a lower alcohol having one or more substituents selected from the group consisting of: methoxy, ethoxy, n-propoxy, i-propoxy, n-butoxy, i-butoxy, sec-butoxy, t-butoxy, or n-pentyloxy; methoxy, ethoxy, n-propoxy, i-propoxy, n-butoxy, i-butoxy, sec-butoxy, t-butoxy, or n-pentyloxy substituted with methoxy, ethoxy, n-propoxy, i-propoxy, n-butoxy, i-butoxy, sec-butoxy, t-butoxy, or n-pentyloxy; amino; and halogen.

18. The method for producing a conductive material according to claim 13, wherein a temperature for heating in the heating step is in a range of 150° C. to 400° C.

* * * * *